(12) United States Patent
Hafizi

(10) Patent No.: US 11,233,506 B1
(45) Date of Patent: Jan. 25, 2022

(54) HYBRID DRIVER WITH A WIDE OUTPUT AMPLITUDE RANGE

(71) Applicant: QUALCOMM Incorporated, San Diego, CA (US)

(72) Inventor: Madjid Hafizi, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/941,230

(22) Filed: Jul. 28, 2020

(51) Int. Cl.
*H03K 17/687* (2006.01)
*G05F 1/46* (2006.01)

(52) U.S. Cl.
CPC ............ *H03K 17/687* (2013.01); *G05F 1/46* (2013.01)

(58) Field of Classification Search
CPC .... H03K 17/687; H03K 17/56; H03K 17/063; H03K 17/0822; H03K 17/08122; H03K 2217/0027; H03K 17/08; H03K 19/018521; H03K 19/018564
USPC ......................................... 327/108, 109, 112
See application file for complete search history.

(56) References Cited

U.S. PATENT DOCUMENTS

| 6,566,911 | B1 | 5/2003 | Moyer |
| 6,989,659 | B2 | 1/2006 | Menegoli et al. |
| 7,545,175 | B2 | 6/2009 | Chen |
| 7,667,502 | B2 * | 2/2010 | Agarwal ............... H04L 25/026 327/108 |
| 7,723,969 | B1 | 5/2010 | Li |
| 7,893,672 | B2 | 2/2011 | Scoones et al. |
| 8,878,513 | B2 | 11/2014 | Wong |
| 9,240,784 | B2 | 1/2016 | Gondi et al. |
| 9,665,112 | B2 | 5/2017 | Singh et al. |
| 9,778,672 | B1 | 10/2017 | Gao et al. |
| 10,110,231 | B1 | 10/2018 | Graves |
| 10,203,709 | B1 | 2/2019 | Feng et al. |
| 10,347,325 | B1 | 7/2019 | Chou et al. |
| 2009/0261867 | A1 * | 10/2009 | Gundo ........... H03K 19/018521 327/108 |
| 2018/0198416 | A1 | 7/2018 | Hur et al. |

FOREIGN PATENT DOCUMENTS

| KR | 100774893 B1 | 11/2007 |
| WO | 2017172343 A1 | 10/2017 |

OTHER PUBLICATIONS

Hassan M., et al., A Hybrid NMOS/PMOS Low-Dropout Regulator with Fast Transient Response for SoC Applications, URL: https://www.researchgate.net/publication/322813499 , Dec. 2017, DOI: 10.1109/ICM.2017.8268850, 5 Pages.
Seidel, A., et al., "Area Efficient Integrated Gate Drivers Based on High-Voltage Charge Storing" IEEE Journal of Solid-State Circuits, vol. 50, No. 7, Jul. 2015. pp. 1550-1559.

* cited by examiner

*Primary Examiner* — Hai L Nguyen
(74) *Attorney, Agent, or Firm* — Loza & Loza, LLP

(57) ABSTRACT

In certain aspects, a driver includes a pull-down transistor coupled between an output and a ground, a pull-up n-type field effect transistor (NFET) coupled between a first voltage rail and the output, and a pull-up p-type field effect transistor (PFET) coupled between the first voltage rail and the output. The driver also includes a first switch coupled between a gate of the pull-up NFET and the ground, and a second switch coupled between a gate of the pull-up PFET and a second voltage rail.

19 Claims, 20 Drawing Sheets

HYBRID DRIVER WITH A WIDE OUTPUT AMPLITUDE RANGE

BACKGROUND

Field

Aspects of the present disclosure relate generally to drivers, and more particularly, to a hybrid driver with a wide output amplitude range.

Background

A driver may be used to drive a signal from a first chip to a second chip via a link (e.g., one or more metal traces, a cable, etc.) to support chip-to-chip communication. In certain aspects, the driver may drive the link with a high-speed serial signal to reduce the pin count of the first chip and the second chip.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a chip including a driver. The driver includes a pull-down transistor coupled between an output and a ground, a pull-up n-type field effect transistor (NFET) coupled between a first voltage rail and the output, and a pull-up p-type field effect transistor (PFET) coupled between the first voltage rail and the output. The driver also includes a first switch coupled between a gate of the pull-up NFET and the ground, and a second switch coupled between a gate of the pull-up PFET and a second voltage rail.

A second aspect relates to a chip including a multi-slice driver. The multi-slice driver includes multiple slices. Each of the multiple slices includes a respective pull-down transistor coupled between a respective output and a ground, a respective pull-up n-type field effect transistor (NFET) coupled between a first voltage rail and the respective output, and a respective pull-up p-type field effect transistor (PFET) coupled between the first voltage rail and the respective output. Each of the multiple slices also includes a respective first switch coupled between a gate of the respective pull-up NFET and the ground, and a respective second switch coupled between a gate of the respective pull-up PFET and a second voltage rail.

A third aspect relates to a chip including a driver. The driver includes a first pull-down transistor coupled between a first output and a ground, a second pull-down transistor coupled between a second output and the ground, a first pull-up n-type field effect transistor (NFET) coupled between a first voltage rail and the first output, a second pull-up NFET coupled between the first voltage rail and the second output, a first pull-up p-type field effect transistor (PFET) coupled between the first voltage rail and the first output, and a second pull-up PFET coupled between the first voltage rail and the second output. The driver also includes a first switch coupled between a gate of the first pull-up NFET and the ground, a second switch coupled between a gate of the second pull-up NFET and the ground, a third switch coupled between a gate of the first pull-up PFET and a second voltage rail, and a fourth switch coupled between a gate of the first pull-up PFET and the second voltage rail.

A third aspect relates to a method for operating a hybrid driver. The hybrid driver includes a pull-down transistor coupled between an output and a ground, a pull-up n-type field effect transistor (NFET) coupled between a voltage rail and the output, and a pull-up p-type field effect transistor (PFET) coupled between the voltage rail and the output. The method includes in a first driver mode, turning off the pull-up PFET, driving a gate of the pull-down transistor with a first input signal and driving a gate of the pull-up NFET with a second input signal. The method also includes, in a second driver mode, turning off the pull-up NFET, driving the gate of the pull-down transistor with the first input signal, and driving a gate of the pull-up PFET with the first input signal.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
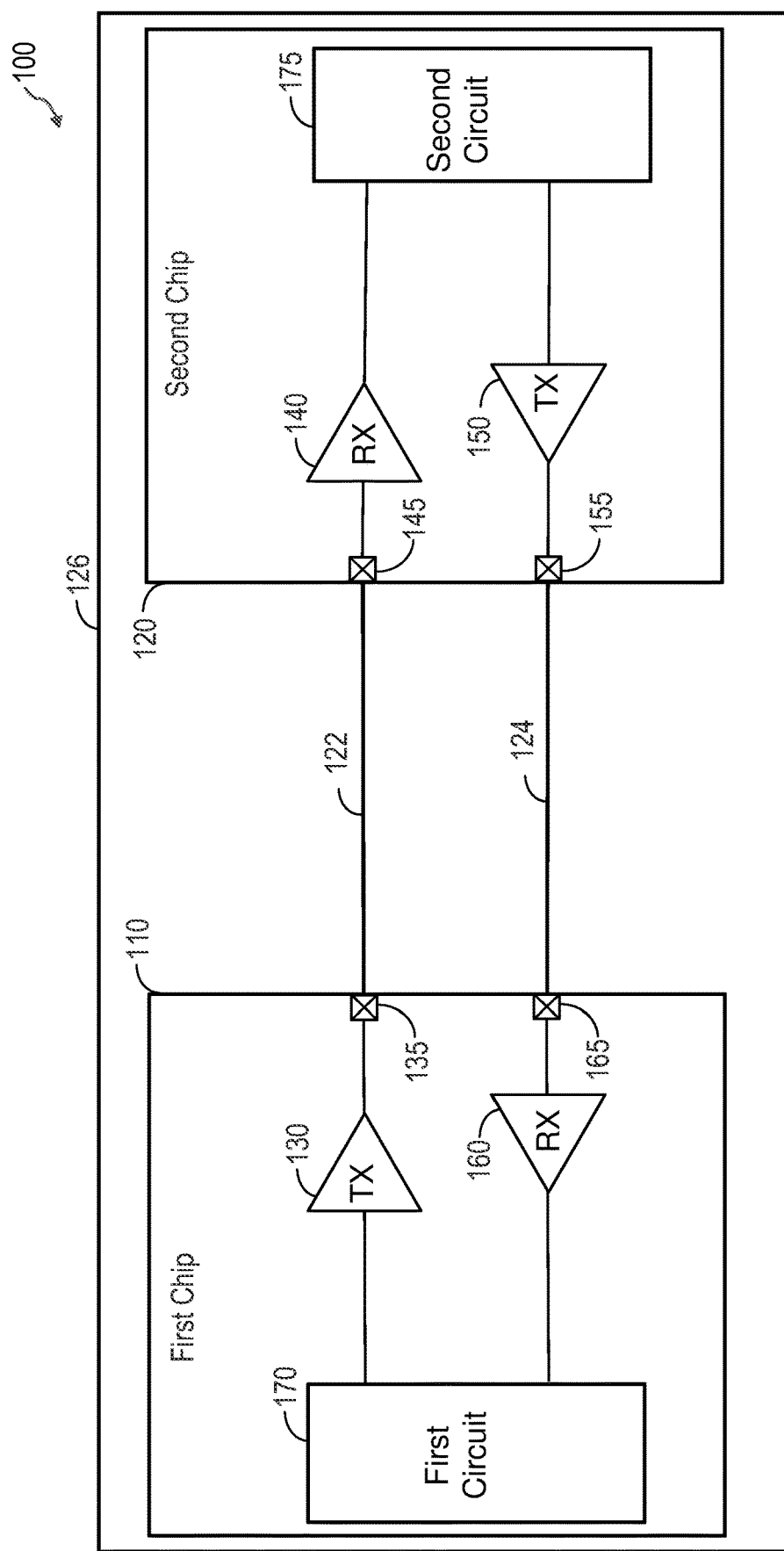
FIG. 1 shows an example of a system including a first chip, a second chip, and drivers for chip-to-chip communication according to certain aspects of the present disclosure.

FIG. 1 shows an example of a system 100 including a first chip 110, a second chip 120, a first link 122, and a second link 124. Each of the links 122 and 124 may include one or more metal traces on a substrate 126 (e.g., a printed circuit board), a cable, etc. The first chip 110 and the second chip 120 may be mounted on the substrate 126, an example of which is shown in FIG. 1. However, it is to be appreciated that this need not be the case.

In this example, the first chip 110 includes a first driver 130 and a first output pin 135 coupled to the output of the first driver 130. The second chip 120 includes a first receiver 140 and a first input pin 145 coupled to the input of the first receiver 140. The first link 122 is coupled between the first output pin 135 on the first chip 110 and the first input pin 145 on the second chip 120.

In operation, the first driver 130 receives a signal from a first circuit 170 on the first chip 110. The first circuit 170 may include a processor, a transceiver, a modem, or another type of circuit. The first driver 130 drives the first link 122 with the signal to transmit the signal from the first chip 110 to the second chip 120. The first receiver 140 on the second chip 120 receives the signal via the first link 122 and outputs the received signal to a second circuit 175 on the second chip 120 for further processing. The second circuit 175 may include a processor, a transceiver, a modem, or another type of circuit. The first receiver 140 may amplify the received signal and/or perform equalization on the received signal to correct for distortion in the received signal caused by frequency-dependent attenuation in the first link 122. In this example, the first driver 130, the first link 122, and the first receiver 140 support communication from the first chip 110 to the second chip 120.

In this example, the second chip 120 also includes a second driver 150 and a second output pin 155 coupled to the output of the second driver 150. The first chip 110 includes a second receiver 160 and a second input pin 165 coupled to the input of the second receiver 160. The second link 124 is coupled between the second output pin 155 on the second chip 120 and the second input pin 165 on the first chip 110.

In operation, the second driver 150 receives a signal from the second circuit 175 on the second chip 120. The second driver 150 drives the second link 124 with the signal to transmit the signal from the second chip 120 to the first chip 110. The second receiver 160 on the first chip 110 receives the signal via the second link 124 and outputs the received signal to the first circuit 170 on the first chip 110 for further processing. The second receiver 160 may amplify the received signal and/or perform equalization on the received signal to correct for distortion in the received signal caused by frequency-dependent attenuation in the second link 124. In this example, the second driver 150, the second link 124, and the second receiver 160 support communication from the second chip 120 to the first chip 110.

Thus, in this example, the drivers 130 and 150, the links 122 and 124, and the receivers 140 and 160 facilitate bidirectional communication between the first chip 110 and the second chip 120. However, it is to be appreciated that, in other implementations, communication may be supported in only one direction. For example, for an implementation where only communication from the first chip 110 to the second chip 120 is supported, the second driver 150, the second link 124, and the second receiver 160 may be omitted. It is also to be appreciated that communication in both directions may be carried on a shared link instead of two separate links (e.g., using time division multiplexing in which signals are transmitted across the shared link in one direction at a time). It is also to be appreciated that the first chip 110 and the second chip 120 may include additional components not shown in FIG. 1. For example, the first chip 110 may include a first pre-driver circuit between the first circuit 170 and the input of the first driver 130 to pre-drive the first driver 130, and the second chip 120 may include a second pre-driver circuit between the second circuit 175 and the input of the second driver 150 to pre-drive the second driver 150.

Figure 2:
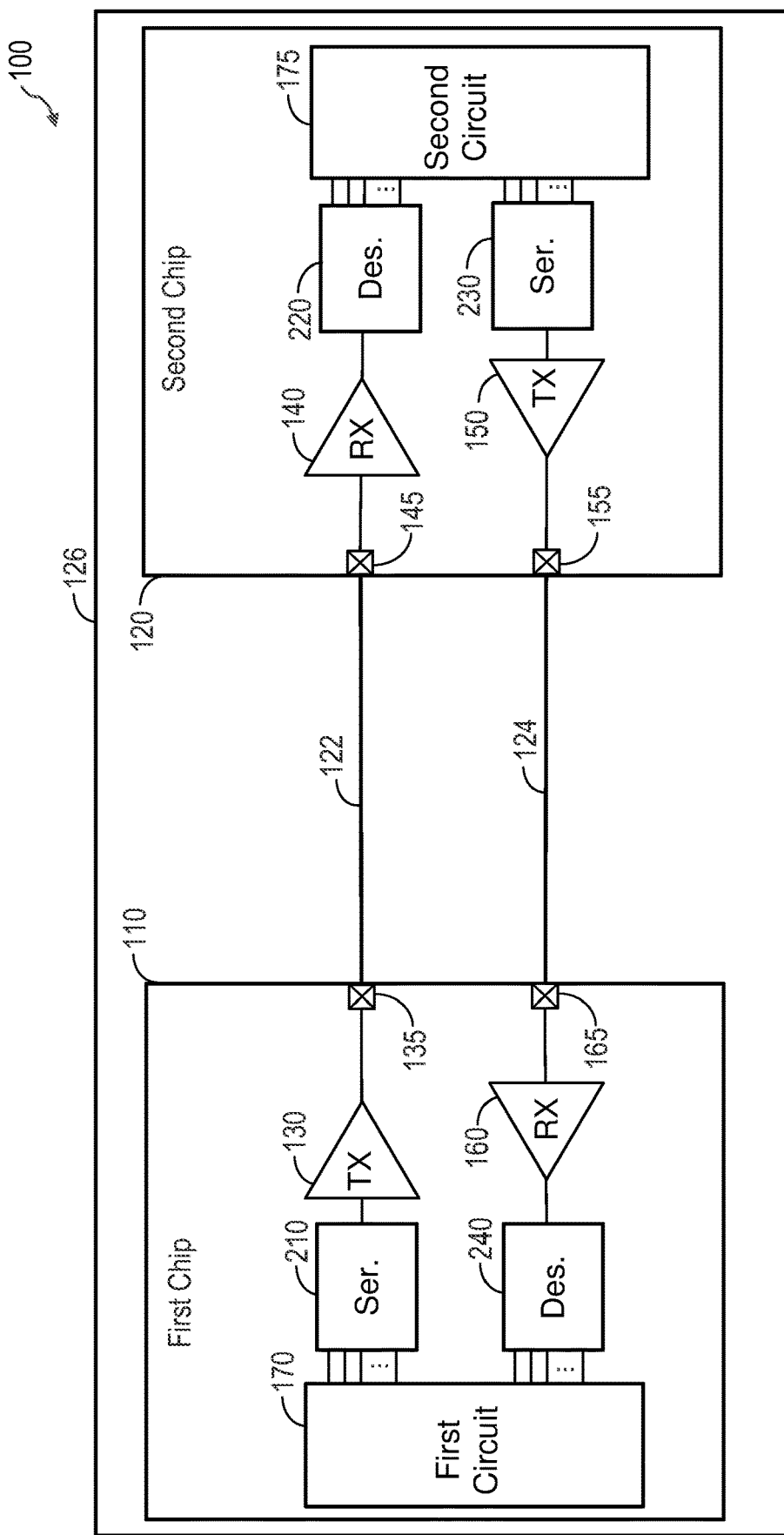
FIG. 2 shows an example of a system in which Serializer/Deserializer (SerDes) is used for chip-to-chip communication according to certain aspects of the present disclosure.

In certain aspects, Serializer/Deserializer (SerDes) may be used to send high-speed serial signals between the first chip 110 and the second chip 120. An advantage of SerDes is that SerDes reduces the pin count of first chip 110 and the second chip 120. An example of SerDes communication between the first chip 110 and the second chip 120 is shown in FIG. 2.

In this example, the first chip 110 includes a first serializer 210 between the first circuit 170 and the input of the first driver 130, and the second chip 120 includes a first deserializer 220 between the output of the first receiver 140 and the second circuit 175. In operation, the first serializer 210 receives parallel signals from the first circuit 170 and converts the received parallel signals into a serial signal. The first driver 130 receives the serial signal and drives the first link 122 with the serial signal. The first receiver 140 on the second chip 120 receives the serial signal via the first link 122 and outputs the received serial signal to the first deserializer 220. The first deserializer 220 converts the received serial signal back into parallel signals and outputs the parallel signals to the second circuit 175 for further processing.

In this example, the second chip 120 also includes a second serializer 230 between the second circuit 175 and the input of the second driver 150, and the first chip 110 includes a second deserializer 240 between the output of the second receiver 160 and the first circuit 170. In operation, the second serializer 230 receives parallel signals from the second circuit 175 and converts the received parallel signals into a serial signal. The second driver 150 receives the serial signal and drives the second link 124 with the serial signal. The second receiver 160 on the first chip 110 receives the serial signal via the second link 124 and outputs the received serial signal to the second deserializer 240. The second deserializer 240 converts the received serial signal back into parallel signals and outputs the parallel signals to the first circuit 170 for further processing.

Figure 3:
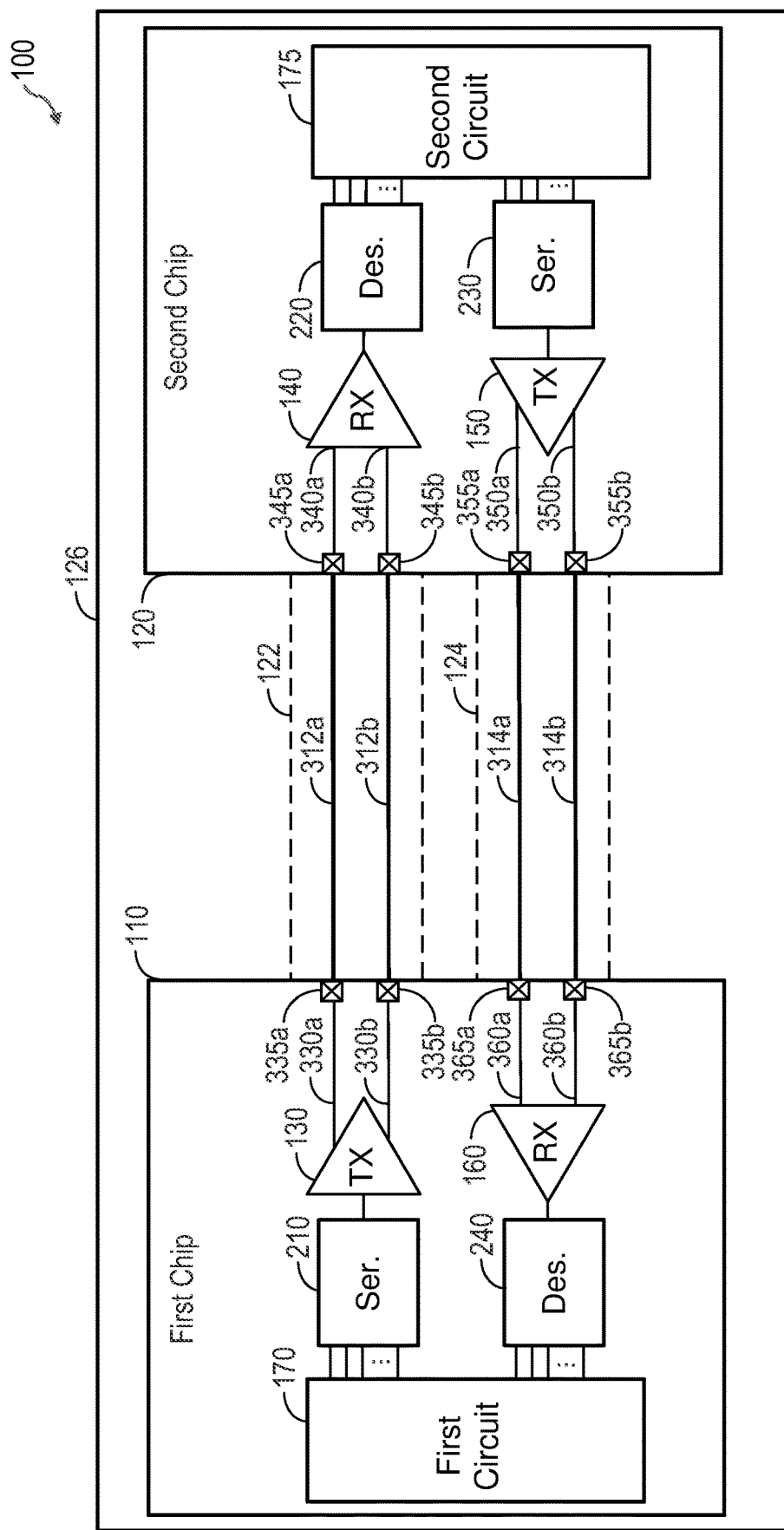
FIG. 3 shows an example of a system in which differential links are used for chip-to-chip communication according to certain aspects of the present disclosure.

In certain aspects, each of the first link 122 and the second link 124 may be a differential link. In this regard, FIG. 3 shows an example in which the first link 122 is a differential link including a first pair of transmission lines 312a and 312b, and the second link 124 is a differential link including a second pair of transmission lines 314a and 314b. Each transmission line 312a, 312b, 314a and 314b may include a metal line on the substrate 126 (e.g., printed circuit board).

In this example, the first driver 130 has a differential output including a pair of outputs 330a and 330b, and the first receiver 140 has a differential input including a pair of inputs 340a and 340b. Output 330a of the first driver 130 is coupled to transmission line 312a via output pin 335a and output 330b of the first driver 130 is coupled to transmission line 312b via output pin 335b. The first driver 130 is configured to drive the transmission lines 312a and 312b with a differential signal. Input 340a of the first receiver 140 is coupled to transmission line 312a via input pin 345a and input 340b of the first receiver 140 is coupled to transmission line 312b via input pin 345b. The first receiver 140 is configured to receive the differential signal at the inputs 340a and 340b.

In this example, the second driver 150 has a differential output including a pair of outputs 350a and 350b, and the second receiver 160 has a differential input including a pair of inputs 360a and 360b. Output 350a of the second driver 150 is coupled to transmission line 314a via output pin 355a and output 350b of the second driver 150 is coupled to transmission line 314b via output pin 355b. The second driver 150 is configured to drive the transmission lines 314a and 314b with a differential signal. Input 360a of the second receiver 160 is coupled to transmission line 314a via input pin 365a and input 360b of the second receiver 160 is coupled to transmission line 314b via input pin 365b. The second receiver 160 is configured to receive the differential signal at the inputs 360a and 360b.

In certain aspects, the drivers 130 and 150 may need to support a wide range of distances between the first chip 110 and the second chip 120. For example, the distance between the first chip 110 and the second chip 120 may vary across different systems (e.g., one inch to over six inches). For a shorter distance, attenuation across the links 122 and 124 is less, allowing the output signal levels (i.e., amplitudes) of the drivers 130 and 150 to be lower to conserve power. For a longer distance, attenuation across the links 122 and 124 is higher, which may require that the output signal levels (i.e., amplitudes) of the drivers 130 and 150 be higher to ensure that sufficient signal levels reach the receivers 140 and 160. Thus, it may be desirable for the drivers 130 and 150 to have a wide output signal level (i.e., amplitude) range to support signal transmission over a wide range of distances between the first chip 110 and the second chip 120.

In some applications, the first chip 110 may be a radio frequency integrated circuit (RFIC) chip and the second chip 120 may be a modem chip. In these applications, the first circuit 170 may include a transceiver and the second circuit 175 may include a modem, in which the drivers 130 and 150 provide chip-to-chip communication (i.e., an interface) between the transceiver and the modem. The data rate between the transceiver and the modem may vary over a wide range (e.g., between 1.5 Gbps to 18 Gbps). For example, the transceiver and the modem may support a wireless communication technology with a wide data rate range. Also, the transceiver and modem may support multiple wireless communication technologies (e.g., fifth generation (5G), fourth generation (4G), third generation (3G), etc.) with different data rates. For a lower data rate, the output signal levels (i.e., amplitudes) of the drivers 130 and 150 may be lower to conserve power. For a higher data rate, the output signal levels (i.e., amplitudes) of the drivers 130 and 150 may need to be higher to ensure sufficient data eyes at the receivers 140 and 160.

Thus, a driver with a wide output signal level (i.e., amplitude) range is desirable to support a wide range of distances between the first chip 110 and the second chip 120 and/or a wide range of data rates. A challenge with achieving a wide output signal level (i.e., amplitude) range is that the output signal level (i.e., amplitude) ranges of current driver designs are limited, as discussed further below.

Figure 4:
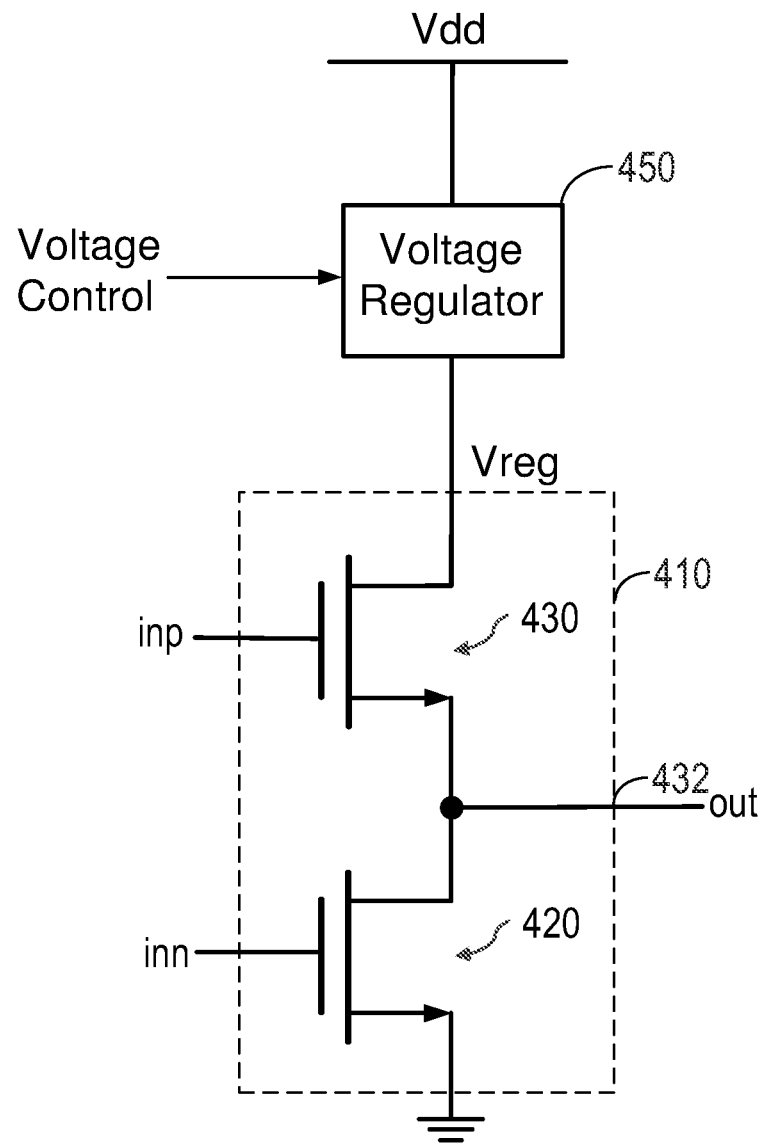
FIG. 4 shows an example of a driver with an NFET-over-NFET architecture according to certain aspects of the present disclosure.

FIG. 4 shows an example of a driver 410 with an NFET-over-NFET architecture ("N-over-N" for short). The driver 410 may be used to implement each of the drivers 130 and 150 in FIGS. 1 to 3 (i.e., each of the drivers 130 and 150 may be a separate instance of the driver 410).

In this example, the driver 410 includes a pull-down n-type field effect transistor (NFET) 420 and a pull-up NFET 430 driven by complementary input signals inn and inp, respectively. The pull-down NFET 420 is configured to pull down the output 432 of the driver 410 when turned on by input signal inn, and the pull-up NFET 430 is configured to pull up the output 432 when turned on by input signal inp. In operation, one of the NFETs 420 and 430 is turned on at a time to drive the output 432 high or low.

The output signal level (i.e., amplitude) of the driver 410 may be adjusted (i.e. tuned) by adjusting the voltage supplied to the driver 410. In this regard, FIG. 4 shows an example in which the voltage supplied to the driver 410 is a regulated voltage Vreg provided by a voltage regulator 450 (e.g., a low dropout (LDO) regulator). In this example, the voltage level of the regulated voltage Vreg is controlled by a voltage control signal input to the voltage regulator 450. Since the output signal level (i.e., amplitude) of the driver 410 depends on the voltage level of the regulated voltage Vreg supplied to the driver 410 (which is controlled by the voltage control signal), the voltage control signal can be used to adjust the output signal level (i.e., amplitude) of the driver 410.

The driver 410 supports low output signal levels which can be used for short distances and/or low data rates to reduce power. However, the upper output signal level of the driver 410 is limited. This is because the source of the pull-up NFET 430 (which is coupled to the output 432) needs to be below the gate voltage of the pull-up NFET 430 by at least the threshold voltage of the pull-up NFET 430 in order for the pull-up NFET 430 to turn on. As a result, the driver 410 may not be able to achieve a high enough output signal level (i.e., amplitude) for the case of a long distance between the chips 110 and 120 and/or a high data rate. In addition, the pull-up NFET 430 does not provide a discharge path from the output 432 of the driver 410 to a clamp device (not shown) during an electrostatic discharge (ESD) event. As a result, the driver 410 may lack ESD robustness.

In the example in FIG. 4, the driver 410 is a single-ended driver. However, it is to be appreciated that a differential version of the driver 410 may be implemented by adding a second pull-up NFET and a second pull-down NFET that drive a second output of the driver 410 in the opposite direction as output 432.

Figure 5:
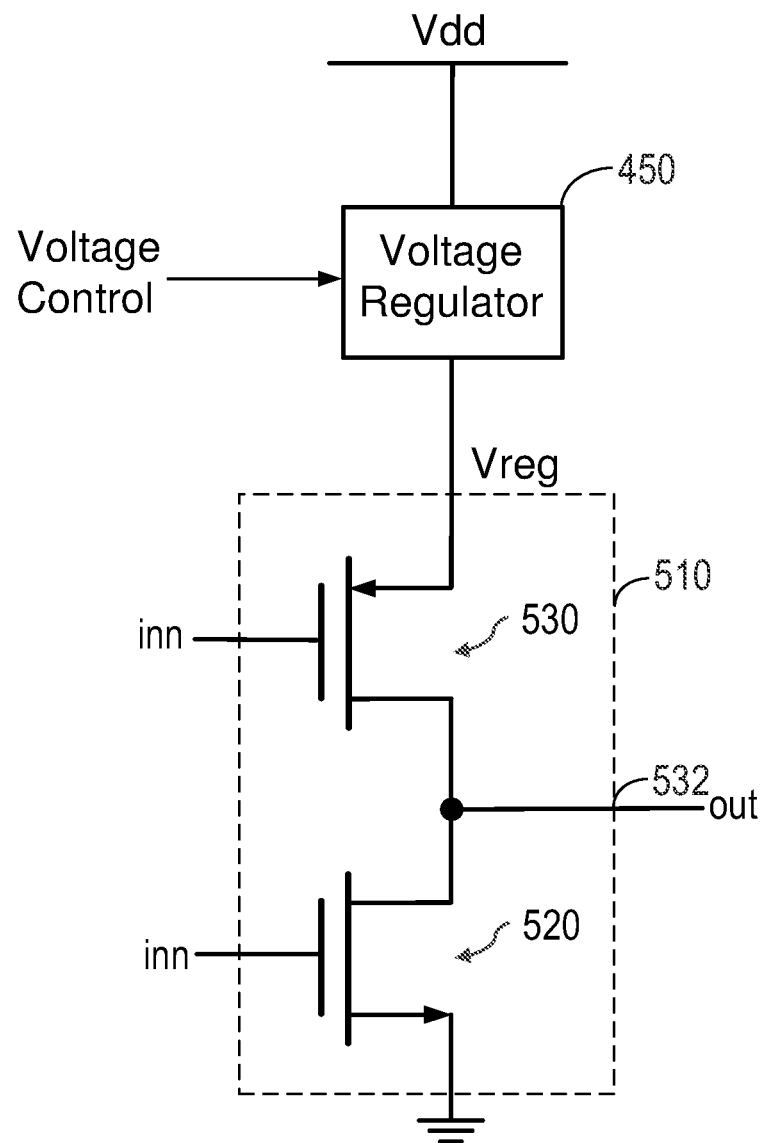
FIG. 5 shows an example of a driver with a PFET-over-NFET architecture according to certain aspects of the present disclosure.

FIG. 5 shows an example of a driver 510 with a PFET-over-NFET architecture ("P-over-N" for short). The driver 510 may be used to implement each of the drivers 130 and 150 in FIGS. 1 to 3 (i.e., each of the drivers 130 and 150 may be a separate instance of the driver 510).

In this example, the driver 510 includes a pull-down n-type field effect transistor (NFET) 520 and a pull-up p-type field effect transistor (PFET) 530 where both the pull-down NFET 520 and the pull-up PFET 530 are driven by the input signal inn. The pull-down NFET 520 is configured to pull down the output 532 of the driver 510 when turned on by the input signal inn, and the pull-up PFET 530 is configured to pull up the output 532 when turned on by the input signal inn. In operation, one of the pull-down NFET 520 and the pull-up PFET 530 is turned on at a time to drive the output 532 high or low.

The output signal level (i.e., amplitude) of the driver 510 may be adjusted (i.e. tuned) by adjusting the voltage supplied to the driver 510. In this regard, FIG. 5 shows an example in which the voltage supplied to the driver 510 is the regulated voltage Vreg provided by the voltage regulator 450 (e.g., LDO regulator) discussed above. In this example, the voltage level of the regulated voltage is controlled by the voltage control signal input to the voltage regulator 450. Since the output signal level (i.e., amplitude) of the driver 510 depends on the voltage level of the regulated voltage Vreg supplied to the driver 510 (which is controlled by the voltage control signal), the voltage control signal can be used to adjust the output signal level (i.e., amplitude) of the driver 510.

The driver 510 supports high output signal levels which can be used for long distances and/or high data rates. However, the lower output signal level of the driver 510 is limited. This is because the source of the pull-up PFET 530 (which is coupled to the regulated voltage Vreg) needs to be at a voltage that is at least equal to the threshold voltage of the pull-up PFET 530 in order for the pull-up PFET 530 to turn on. This limits how low the regulated voltage Vreg can be set, which, in turn, limits the lower output signal level of the driver 510. As a result, the driver 510 may not be able to achieve a low output signal level (i.e., amplitude) for the case of a short distance between the chips 110 and 120 and/or a low data rate.

In the example in FIG. 5, the driver 510 is a single-ended driver. However, it is to be appreciated that a differential version of the driver 510 may be implemented by adding a second pull-down NFET and a second pull-up PFET that drive a second output of the driver 510 in the opposite direction as output 532.

Thus, a driver with a wider output signal level (i.e., amplitude) range than the P-over-N driver 510 and the N-over-N driver 410 is desirable in order to support a wider range of distances between the chips 110 and 120 and/or a wider range of data rates.

Aspects of the present disclosure provide a hybrid driver that combines the N-over-N driver architecture and the P-over-N driver architecture to achieve a wide output signal level (i.e., amplitude) range, as discussed further below.

Figure 6:
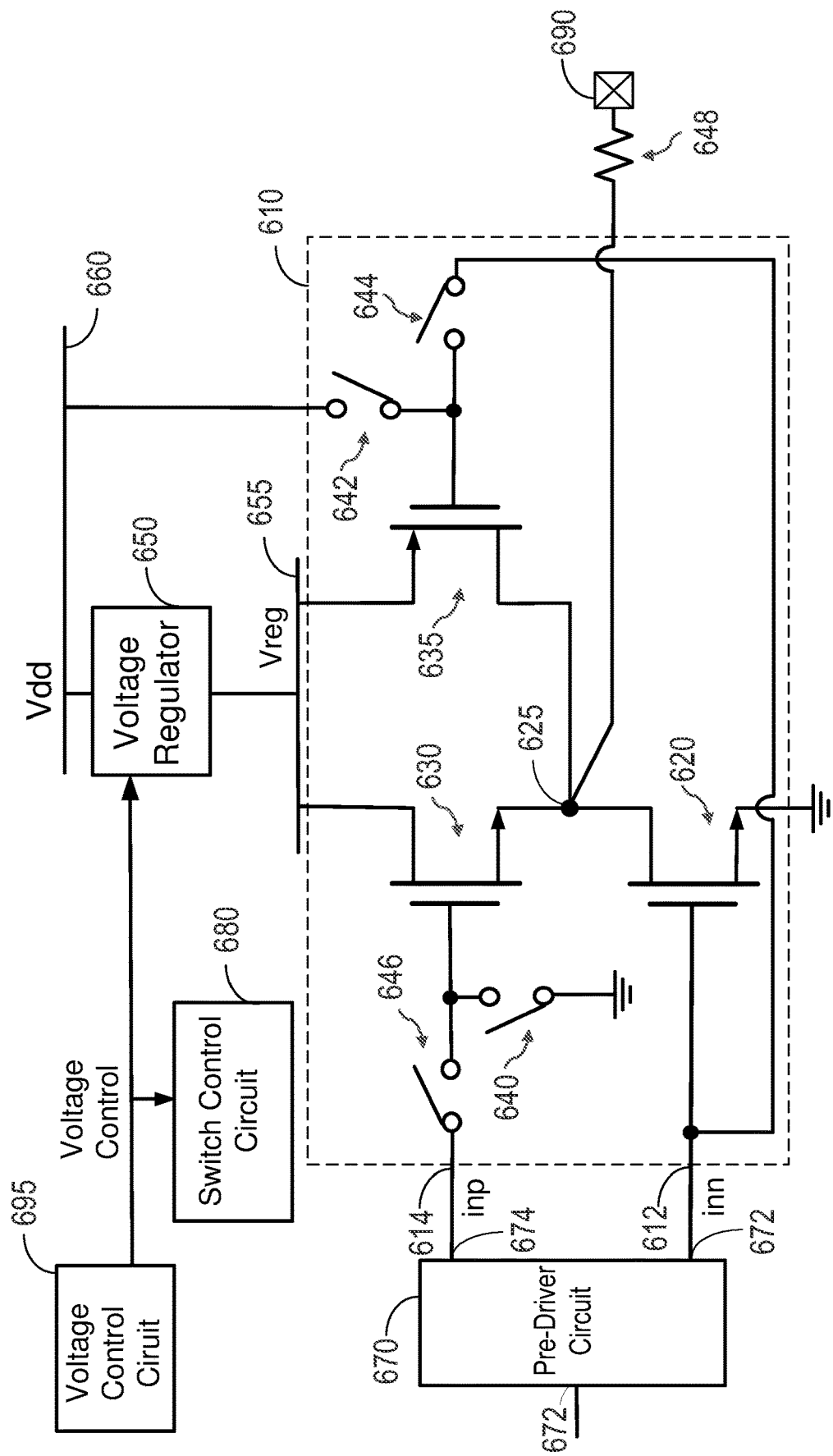
FIG. 6 shows an example of a hybrid driver according to certain aspects of the present disclosure.

FIG. 6 shows an example of a hybrid driver 610 with a wide output signal level (i.e., amplitude) range according to aspects of the present disclosure. The hybrid driver 610 includes a pull-down NFET 620, a pull-up NFET 630, and a pull-up PFET 635. In the example in FIG. 6, the pull-down NFET 620 is coupled between a output 625 of the driver 610 and a ground with the drain of the pull-down NFET 620 coupled to the output 625 and the source of the pull-down NFET 620 coupled to the ground. The pull-up NFET 630 is coupled between a first voltage rail 655 and the output 625 with the drain of the pull-up NFET 630 coupled to the first voltage rail 655 and the source of the pull-up NFET 630 coupled to the output 625. The pull-up PFET 635 is coupled between the first voltage rail 655 and the output 625 with the source of the pull-up PFET 635 coupled to the first voltage rail 655 and the drain of the pull-up PFET 635 coupled to the output 625. The pull-down NFET 620 is configured to pull down the output 625 when turned on, the pull-up NFET 630 is configured to pull up the output 625 when turned on, and the pull-up PFET 635 is configured to pull up the output 625 when turned on, as discussed further below.

The hybrid driver 610 also includes a first switch 640, a second switch 642, a third switch 644, and a fourth switch 646. Each of the switches 640, 642, 644 and 646 may be implemented with a transmission gate, an NFET, a PFET, or another type of switch. In the example in FIG. 6, the first switch 640 is coupled between the gate of the pull-up NFET 630 and the ground, the second switch 642 is coupled between the gate of the pull-up PFET 635 and a second voltage rail 660, the third switch 644 is coupled between the gate of the pull-up PFET 635 and a first input 612 of the driver 610, and the fourth switch 646 is coupled between the gate of the pull-up NFET 630 and a second input 614 of the driver 610. The gate of the pull-down NFET 620 is coupled to the first input 612.

The first input 612 and the second input 614 are complementary inputs driven by complementary input signals inn and inp, respectively. In certain aspects, the complementary input signals inn and inp may be generated by a pre-driver circuit 670, an example of which is shown in FIG. 6. In this example, the pre-driver circuit 670 has an input 672, a first output 672 coupled to the first input 612 of the driver 610, and a second output 674 coupled to the second input 614 of the driver 610. The pre-driver circuit 670 may receive an input signal at the input 672 (e.g., from the first circuit 170, the second circuit 175, the first serializer 210 or the second serializer 230) and generate the complementary input signals inn and inp from the input signal. The pre-driver circuit 670 outputs input signal inn from the first output 672 and outputs input signal inp from the second output 674.

As discussed further below, the switches 640, 642, 644 and 646 are configured to switch the hybrid driver 610 between an N-over-N driver mode and a P-over-N driver mode. In one example, the hybrid driver 610 is operated in the N-over-N driver mode to support a first amplitude range (e.g., 50 mV to 400 mV) and operated in the P-over-N driver mode to support a second amplitude range (e.g., 425 mV to 700 mV). In this example, the amplitude range of the hybrid driver 610 is a combination of the first amplitude range and the second amplitude range. This allows the hybrid driver 610 to achieve a wide amplitude range, as discussed further below.

In the example in FIG. 6, a voltage regulator 650 is coupled between the second voltage rail 660 and the first voltage rail 655. The voltage regulator 650 is configured to generate a regulated voltage Vreg from a supply voltage Vdd on the second voltage rail 660. The supply voltage Vdd may be provided by a power management integrated circuit (PMIC) coupled to the second voltage rail 660. The voltage regulator 650 may be implemented with an LDO regulator or another type of voltage regulator. In this example, the regulated voltage Vreg is controlled by a voltage control signal input to the voltage regulator 650. The output signal level (i.e., amplitude) of the driver 610 depends on the regulated voltage Vreg on the first voltage rail 655. Since the output signal level (i.e., amplitude) depends on the regulated voltage and the voltage control signal controls the regulated voltage Vreg, the voltage control signal can be used to adjust (i.e., tune) the output signal level (i.e., amplitude) of the driver 610, as discussed further below. The voltage control signal may be a digital control signal or an analog control signal. The voltage control signal may come from a voltage control circuit 695 coupled to the voltage regulator 650. The voltage control circuit 695 may control the output signal level of the driver 610 using the voltage control signal, for example, based on a data rate of the input signals inn and inp and/or a distance between the first chip 110 and the second chip 120. For example, the voltage control circuit 695 may increase the output signal level for a higher data rate and/or increase the output signal level for a longer distance between the first chip 110 and the second chip 120.

In the example in FIG. 6, the output 625 is coupled to an output pin 690 via a resistor 648. The output pin 690 may be coupled to a link (e.g., link 122 or 124) and may correspond to output pin 135 or 155. The resistor 648 may be configured to provide impedance matching between the driver 610 and the link (not shown in FIG. 6) coupled to the output pin 690.

In this example, a switch control circuit 680 controls the switches 640, 642, 644 and 646 to selectivity operate the hybrid driver 610 in the N-over-N driver mode or the P-over-N driver mode. For ease of illustration, the individual connections between the switch control circuit 680 and the switches 640, 642, 644 and 646 are not explicitly shown in FIG. 6.

To operate the hybrid driver 610 in the N-over-N driver mode, the switch control circuit 680 turns on the second switch 642 and turns off the third switch 644. This turns off the pull-up PFET 635 and decouples the gate of the pull-up PFET from the first input 612. The switch control circuit 680 also turns off the first switch 640 and turns on the fourth switch 646 to couple the gate of the pull-up NFET 630 to the second input 614. In the N-over-N driver mode, the hybrid driver 610 implements the N-over-N driver 410 illustrated in FIG. 4, which supports low output signal levels (i.e., low amplitudes).

To operate the hybrid driver 610 in the P-over-N driver mode, the switch control circuit 680 turns off the second switch 642 and turns on the third switch 644 to couple the gate of the pull-up PFET 635 to the first input 612. The switch control circuit 680 also turns on the first switch 640 and turns off the fourth switch 646. This turns off the pull-up NFET 630 and decouples the gate of the pull-up NFET 630 from the second input 614. In the P-over-N driver mode, the hybrid driver 610 implements the P-over-N driver 510 illustrated in FIG. 5, which supports high output signal levels.

In certain aspects, the switch control circuit 680 operates the hybrid driver 610 in the N-over-N driver mode or the P-over-N driver mode based on the regulated voltage Vreg on the first voltage rail 655. As discussed above, the amplitude of the driver 610 depends on the regulated voltage Vreg. In this example, if the regulated voltage Vreg is within a first regulated voltage range corresponding to the first amplitude range (e.g., 50 mV to 400 mV) of the driver 610, then the switch control circuit 680 operates the hybrid driver 610 in the N-over-N driver mode. If the regulated voltage Vreg is within a second regulated voltage range corresponding to the second amplitude range (e.g., 425 mV to 700 mV) of the driver 610, then the switch control circuit 680 operates the hybrid driver 610 in the P-over-N driver mode. As discussed above, the amplitude range of the hybrid driver 610 is the combination of the first amplitude range and the second amplitude range, which allows the hybrid driver 610 to achieve a wide amplitude range.

Since the regulated voltage Vreg is controlled by the voltage control signal, the switch control circuit 680 may operate the hybrid driver 610 in the N-over-N driver mode or the P-over-N driver mode based on the voltage control signal. In this regard, FIG. 6 shows an example in which the voltage control signal is input to the switch control circuit 680. In this example, the switch control circuit 680 operates the hybrid driver 610 in the N-over-N driver mode when the voltage control signal sets the regulated voltage Vreg to a voltage level within the first regulated voltage range corresponding to the first amplitude range (e.g., 50 mV to 400 mV) of the driver 610. The switch control circuit 680 operates the hybrid driver 610 in the P-over-N driver mode when the voltage control signal sets the regulated voltage Vreg to a voltage level within the second regulated voltage range corresponding to the second amplitude range (e.g., 425 mV to 700 mV) of the driver 610. Thus, in this example, the voltage control signal may be used to control both the amplitude of the hybrid driver 610 and the driver mode of the hybrid driver 610.

In certain aspects, the voltage control signal is a digital control signal (also referred to as a digital code) in which the voltage level of the regulated voltage Vreg is set by the value of the voltage control signal. In one example, the voltage control signal includes n bits. In this example, the voltage control signal has $2^n$ possible values, in which each of the $2^n$ possible values corresponds to a respective one of $2^n$ selectable voltage levels for the regulated voltage Vreg. Thus, in this example, the voltage control circuit 695 can set the regulated voltage Vreg to any one of the $2^n$ selectable voltage levels by setting the voltage control signal (e.g., digital code) to the corresponding value.

In one example, a first set of values for the voltage control signal corresponds to voltage levels within the first regulated voltage range and a second set of values for the voltage control signal corresponds to voltage levels within the second regulated voltage range. As discussed above, the first regulated voltage range corresponds to the first amplitude range (e.g., 50 mV to 400 mV) of the driver 610 and the second regulated voltage range corresponds to the second amplitude range (e.g., 425 mV to 700 mV) of the driver 610. Thus, in this example, the first set of values covers the first amplitude range and the second set of values covers the second amplitude range. In this example, the switch control circuit 680 may be configured to operate the driver 610 in the N-over-N driver mode if the current value of the voltage control signal is in the first set of values (i.e., the voltage control signal has one of the first set of values) and operate the driver 610 in the P-over-N driver mode if the current value of the voltage control signal is in the second set of values (i.e., the voltage control signal has one of the second set of values).

Figure 7:
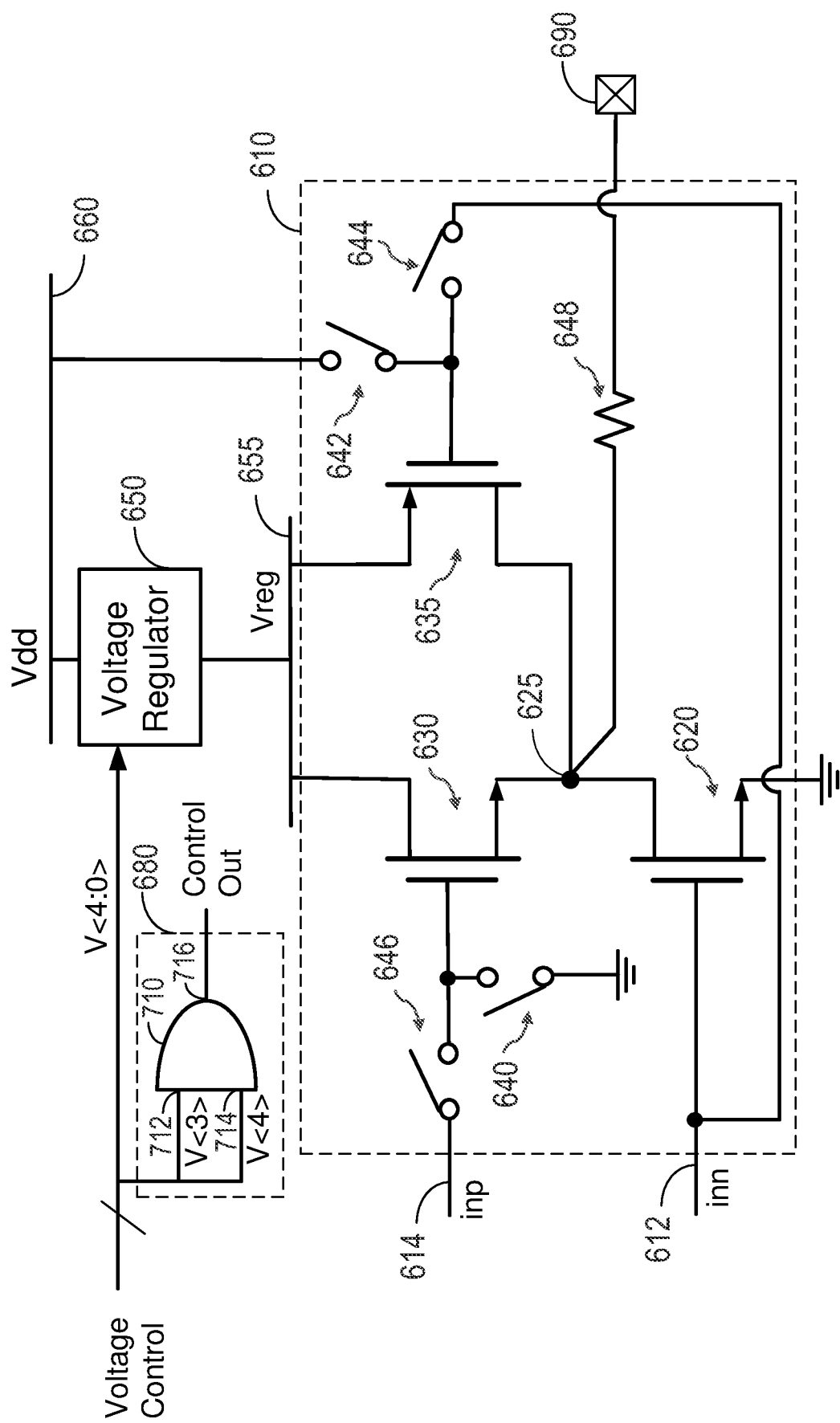
FIG. 7 shows an exemplary implementation of a switch control circuit according to certain aspects of the present disclosure.

In one example, the voltage control signal includes five bits with 32 possible values ranging from 0 to 31. An example of this is illustrated in FIG. 7 in which the voltage control signal is labeled V<4:0> indicating the voltage control signal includes five bits. In this example, the first set of values may include the values 0 to 23 and the second set of values may include the values 24 to 31. Thus, in this example, the values 0 to 23 cover the first amplitude range (e.g., 50 mV to 400 mV) of the driver 610 and the values 24-31 cover the second amplitude range (e.g., 425 mV to 700 mV) of the driver 610. In this example, the switch control circuit 680 operates the driver 610 in the N-over-N driver mode if the current value of the voltage control signal is in the range of 0 to 23 and operates the driver 610 in the P-over-N driver mode if the current value of the voltage control signal is in the range of 24 to 31.

In the example in FIG. 7, the switch control circuit 680 is implemented with an AND gate 710 including a first input 712, a second input 714, and an output 716. The first input 712 receives the second most significant bit V<3> of the voltage control signal and the second input 714 receives the most significant bit V<4> of the voltage control signal. In this example, the AND gate 710 performs an AND operation on the bits V<3> and V<4> to generate a control signal for the switches 640, 642, 644 and 646. The AND gate 710 outputs a one when both bits V<3> and V<4> are one, which occurs when the value of the voltage control signal is in the range of 24 to 31 (i.e., the value of the voltage control signal is in the second set of values corresponding to the second amplitude range). The AND gate 710 outputs a zero when one of the bits V<3> and V<4> is zero or both of the bits V<3> and V<4> are zero, which occurs when the value of the voltage control signal is in the range of 0 to 23 (i.e., the value of the voltage control signal is in the first set of values corresponding to the first amplitude range). Thus, the AND gate 710 outputs a one when the value of the voltage control signal is in the range of 24 to 31 and outputs a zero when the value of the voltage control signal is in the range of 0 to 23. In this example, the switches 640, 642, 644 and 646 are configured such that the first switch 640 and the third switch 644 turn on and the second switch 642 and the fourth switch 646 turn off when the switch control signal outputs a one. This causes the driver 610 to operate in the P-over-N driver mode when the value of the voltage control signal is in the range of 24 to 31. The switches 640, 642, 644 and 646 are configured such that the first switch 640 and the third switch 644 turn off and the second switch 642 and the fourth switch 646 turn on when the switch control signal outputs a zero. This causes the driver 610 to operate the driver in the N-over-N driver mode when the value of the voltage control signal is in the range of 0 to 23.

It is to be appreciated that the switch control circuit 680 is not limited to the exemplary implementation shown in FIG. 7. The switch control circuit 680 may be implemented with various logic gates and/or various combinations of logic gates. Also, it is to be appreciated that, in other implementations, the voltage control signal may include less than five bits or more than five bits.

Figure 8:
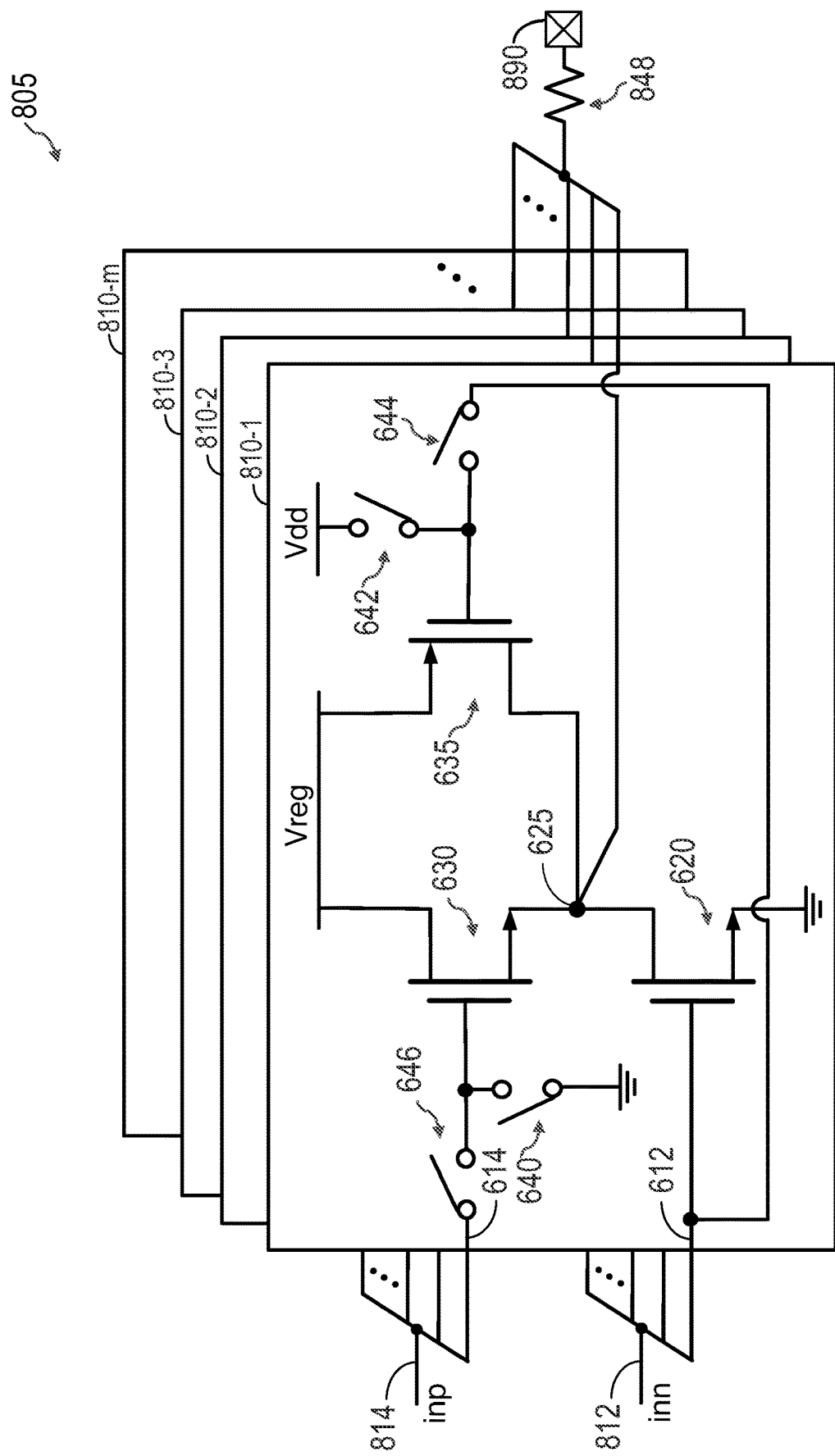
FIG. 8 shows an example of a hybrid driver including multiple slices according to certain aspects of the present disclosure.

The exemplary hybrid driver 610 shown in FIG. 6 may be used to implement a multi-slice hybrid driver 805, an example of which is shown in FIG. 8. In this example, the multi-slice hybrid driver 805 includes multiple slices 810-1 to 810-*m* coupled in parallel between the first voltage rail 655 and the ground. Each of the slices 810-1 to 810-*m* is implemented with the exemplary hybrid driver 610 shown in FIG. 6 (i.e., each of the slices 810-1 to 810-*m* is a separate instance of the hybrid driver 610 shown in FIG. 6). As shown in FIG. 8, the outputs 625 of the slices 810-1 to 810-*m* are coupled to an output pin 890 via the resistor 848 (i.e., the resistor 848 is coupled between the outputs 625 of the slices 810-1 to 810-*m* and the output pin 890). The output pin 890 may be coupled to a link (e.g., link 122 or 124) and may correspond to output pin 135 or 155.

The first inputs 612 of the slices 810-1 to 810-*m* are coupled to a first input 812 of the multi-slice hybrid driver 805, and the second inputs 614 of the slices 810-1 to 810-*m* are coupled to a second input 814 of the multi-slice hybrid driver 805. The first input 812 and the second input 814 are driven by complementary input signals inn and inp, respectively.

The switch control circuit 680 (shown in FIG. 6) controls the switches 640, 642, 644 and 646 in the slices 810-1 to 810-*m* to selectively operate the multi-slice hybrid driver 805 in the N-over-N driver mode or the P-over-N driver mode. For example, the switch control circuit 680 may operate the multi-slice hybrid driver 805 in the N-over-N driver mode when the regulated voltage Vreg is in the first regulated voltage range corresponding to the first amplitude range (e.g., 50 mV to 400 mV), and operate the multi-slice hybrid driver 805 in the P-over-N driver mode when the regulated voltage Vreg is in the second regulated voltage range corresponding to the second amplitude range (e.g., 425 mV to 700 mV). Note that the voltage regulator 650 is not shown in FIG. 8.

In certain aspects, the number of the slices 810-1 to 810-*m* that are active (i.e., enabled) at a given time may be adjusted (e.g., using switches). For example, the number of the slices 810-1 to 810-*m* that are active (i.e., enabled) may be adjusted to adjust the output impedance of the multi-slice hybrid driver 805. In this example, the output impedance of the multi-slice hybrid driver 805 may be adjusted (i.e., calibrated) to provide impedance matching with the link (e.g., link 122 or 124) coupled to the output pin 890.

Figure 9:
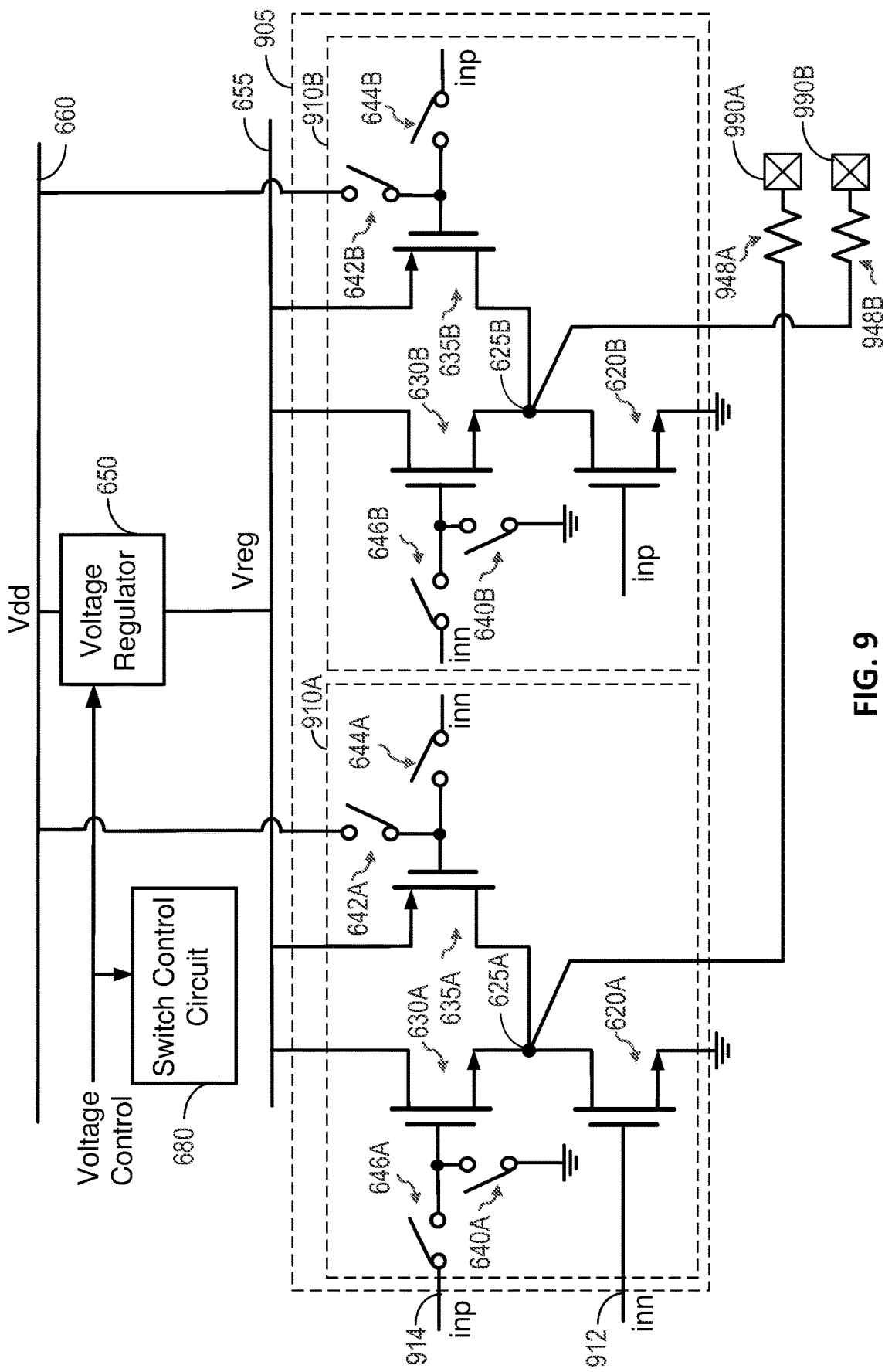
FIG. 9 shows an example of a differential hybrid driver according to certain aspects of the present disclosure.

FIG. 9 shows a differential hybrid driver 905 according to certain aspects. The differential driver 905 includes a first branch 910A and a second branch 910B. Each of the first branch 910A and the second branch 910B may be implemented with the hybrid driver 610 shown in FIG. 6 (i.e., each branch may be a separate instance of the hybrid driver 610). In FIG. 9, the reference numbers for the elements of the first branch 910A include the letter "A" and the reference numbers for the elements of the second branch 910B include the letter "B." As discussed further below, the first branch 910A and second branch 910B are driven in opposite directions to generate a differential output signal.

The first branch 910A includes a first pull-down NFET 620A, a first pull-up NFET 630A, and a first pull-up PFET 635A. The first pull-down NFET 620A is coupled between a first output 625A and a ground with the drain of the first pull-down NFET 620A coupled to the first output 625A and the source of the first pull-down NFET 620 coupled to the ground. The first pull-up NFET 630A is coupled between the first voltage rail 655 and the first output 625A with the drain of the first pull-up NFET 630A coupled to the first voltage rail 655 and the source of the first pull-up NFET 630A coupled to the first output 625A. The first pull-up PFET 635A is coupled between the first voltage rail 655 and the first output 625A with the source of the first pull-up PFET 635A coupled to the first voltage rail 655 and the drain of the first pull-up PFET 635A coupled to the first output 625A.

The second branch 910B includes a second pull-down NFET 620B, a second pull-up NFET 630B, and a second pull-up PFET 635B. The second pull-down NFET 620B is coupled between a second output 625B and the ground with the drain of the second pull-down NFET 620B coupled to the second output 625B and the source of the second pull-down NFET 620B coupled to the ground. The second pull-up NFET 630B is coupled between the first voltage rail 655 and the second output 625B with the drain of the second pull-up NFET 630B coupled to the first voltage rail 655 and the source of the second pull-up NFET 630B coupled to the second output 625B. The second pull-up PFET 635B is coupled between the first voltage rail 655 and the second output 625B with the source of the second pull-up PFET 635B coupled to the first voltage rail 655 and the drain of the second pull-up PFET 635B coupled to the second output 625B.

In the example in FIG. 9, the driver 905 includes a first switch 640A coupled between the gate of the first pull-up NFET 630A and the ground, a second switch 640B coupled between the gate of the second pull-up NFET 630B and the ground, a third switch 642A coupled between the gate of the first pull-up PFET 635A and the second voltage rail 660, and a fourth switch 642B coupled between the gate of the second pull-up PFET 635B and the second voltage rail 660. The driver 905 also includes a fifth switch 644A coupled between the gate of the first pull-up PFET 635A and a first input 912 of the driver 905, a sixth switch 644B coupled between the gate of the second pull-up PFET 635B and a second input 914 of the driver 905, a seventh switch 646A coupled between the gate of the first pull-up NFET 630A and the second input 914, and an eighth switch 646B coupled between the gate of the second pull-up NFET 630B and the first input 912. The gate of the first pull-down NFET 620A is coupled to the first input 912 and the gate of the second pull-down NFET 620B is coupled to the second input 914.

The first input 912 and the second input 914 are complementary inputs driven by complementary input signals inn and inp, respectively. The complementary input signals inn and inp may be provided by the pre-driver circuit 670 (shown in FIG. 6) as discussed above. In this example, the first output 672 of the pre-driver circuit 670 may be coupled to the first input 912 and the second output 674 of the pre-driver circuit 670 may be coupled to the second input 914.

In this example, the inputs to the second branch 910B are reversed with respect to the inputs to the first branch 910A so that the complementary input signals inn and inp drive the first branch 910A and the second branch 910B in opposite directions to generate a differential output signal. More particularly, input signal inn drives the first pull-down NFET 620A in the first branch 910A and the input signal inp drives the second pull-down NFET 620B in the second branch 910B. In the N-over-N driver mode, the input signal inp drives the first pull-up NFET 630A in the first branch 910A and the input signal inn drives the second pull-up NFET 630B in the second branch 910B. In the P-over-N driver mode, the input signal inn drives the first pull-up PFET 635A in the first branch 910A and the input signal inp drives the second pull-up PFET 635B in the second branch 910B.

In the example in FIG. 9, the first output 625A is coupled to a first output pin 990A via a first resistor 948A (i.e., the first resistor 948A is coupled between the first output 625A and the first output pin 990A). The second output 625B is coupled to a second output pin 990B via a second resistor 948B (i.e., the second resistor 948B is coupled between the second output 625B and the second output pin 990B). The first output pin 990A and the second output pin 990B may be coupled to a differential link in which the first output pin 990A is coupled to a first transmission line (e.g., transmission line 312a or 314a) of the differential link and the second output pin 990B is coupled to a second transmission line (e.g., transmission line 312b or 314b) of the differential link In this example, the switch control circuit 680 controls the switches in the first branch 910A and the second branch 920 to selectivity operate the differential hybrid driver 905 in the N-over-N driver mode or the P-over-N driver mode. For ease of illustration, the individual connections between the switch control circuit 680 and the switches are not explicitly shown in FIG. 9.

To operate the differential hybrid driver 905 in the N-over-N driver mode, the switch control circuit 680 turns off the first switch 640A, turns off the second switch 640B, turns on the third switch 642A, turns on the fourth switch 642B, turns off the fifth switch 644A, turns off the sixth switch 644B, turns on the seventh switch 646A, and turns on the eighth switch 646B. This couples the gate of the first pull-up NFET 630A to the second input 914, couples the gate of the second pull-up NFET 630B to the first input 912, and turns off the first pull-up PFET 635A and the second pull-up PFET 635B. In the N-over-N driver mode, the differential hybrid driver 905 implements a differential N-over-N driver.

To operate the differential hybrid driver 905 in the P-over-N driver mode, the switch control circuit 680 turns on the first switch 640A, turns on the second switch 640B, turns off the third switch 642A, turns off the fourth switch 642B, turns on the fifth switch 644A, turns on the sixth switch 644B, turns off the seventh switch 646A, and turns off the eighth switch 646B. This couples the gate of the first pull-up PFET 635A to the first input 912, couples the gate of the second pull-up PFET 635B to the second input 914, and turns off the first pull-up NFET 630A and the second pull-up NFET 630B. In the P-over-N driver mode, the differential hybrid driver 905 implements a differential P-over-N driver.

The switch control circuit 680 may operate the differential hybrid driver 905 in the N-over-N driver mode or the P-over-N driver mode based on the regulated voltage Vreg on the first voltage rail 655. For example, if the regulated voltage Vreg is within the first regulated voltage range corresponding to the first amplitude range (e.g., 50 mV to 400 mV) of the driver 905, then the switch control circuit 680 operates the hybrid driver 905 in the N-over-N driver mode. If the regulated voltage Vreg is within the second regulated voltage range corresponding to the second amplitude range (e.g., 425 mV to 700 mV) of the driver 905, then the switch control circuit 680 operates the hybrid driver 905 in the P-over-N driver mode.

Since the regulated voltage Vreg is controlled by the voltage control signal, the switch control circuit 680 may operate the hybrid driver 905 in the N-over-N driver mode or the P-over-N driver mode based on the voltage control signal. In this regard, FIG. 9 shows an example in which the voltage control signal is input to the switch control circuit 680. In this example, the switch control circuit 680 operates the hybrid driver 905 in the N-over-N driver mode when the voltage control signal sets the regulated voltage Vreg to a voltage level within the first regulated voltage range corresponding to the first amplitude range (e.g., 50 mV to 400 mV) of the driver 905. The switch control circuit 680 operates the hybrid driver 905 in the P-over-N driver mode when the voltage control signal sets the regulated voltage Vreg to a voltage level within the second regulated voltage range corresponding to the second amplitude range (e.g., 425 mV to 700 mV) of the driver 905.

As discussed above, the voltage control signal may be a digital control signal (also referred to as a digital code) in which the voltage level of the regulated voltage Vreg is set by the value of the voltage control signal. In one example, a first set of values for the voltage control signal corresponds to voltage levels within the first regulated voltage range and a second set of values for the voltage control signal corresponds to voltage levels within the second regulated voltage range. As discussed above, the first regulated voltage range corresponds to the first amplitude range (e.g., 50 mV to 400 mV) of the driver 905 and the second regulated voltage range corresponds to the second amplitude range (e.g., 425 mV to 700 mV) of the driver 905. Thus, in this example, the first set of values covers the first amplitude range and the second set of values covers the second amplitude range. In this example, the switch control circuit 680 may be configured to operate the driver 905 in the N-over-N driver mode if the current value of the voltage control signal is in the first set of values and operate the driver 905 in the P-over-N driver mode if the current value of the voltage control signal is in the second set of values.

Figure 10:
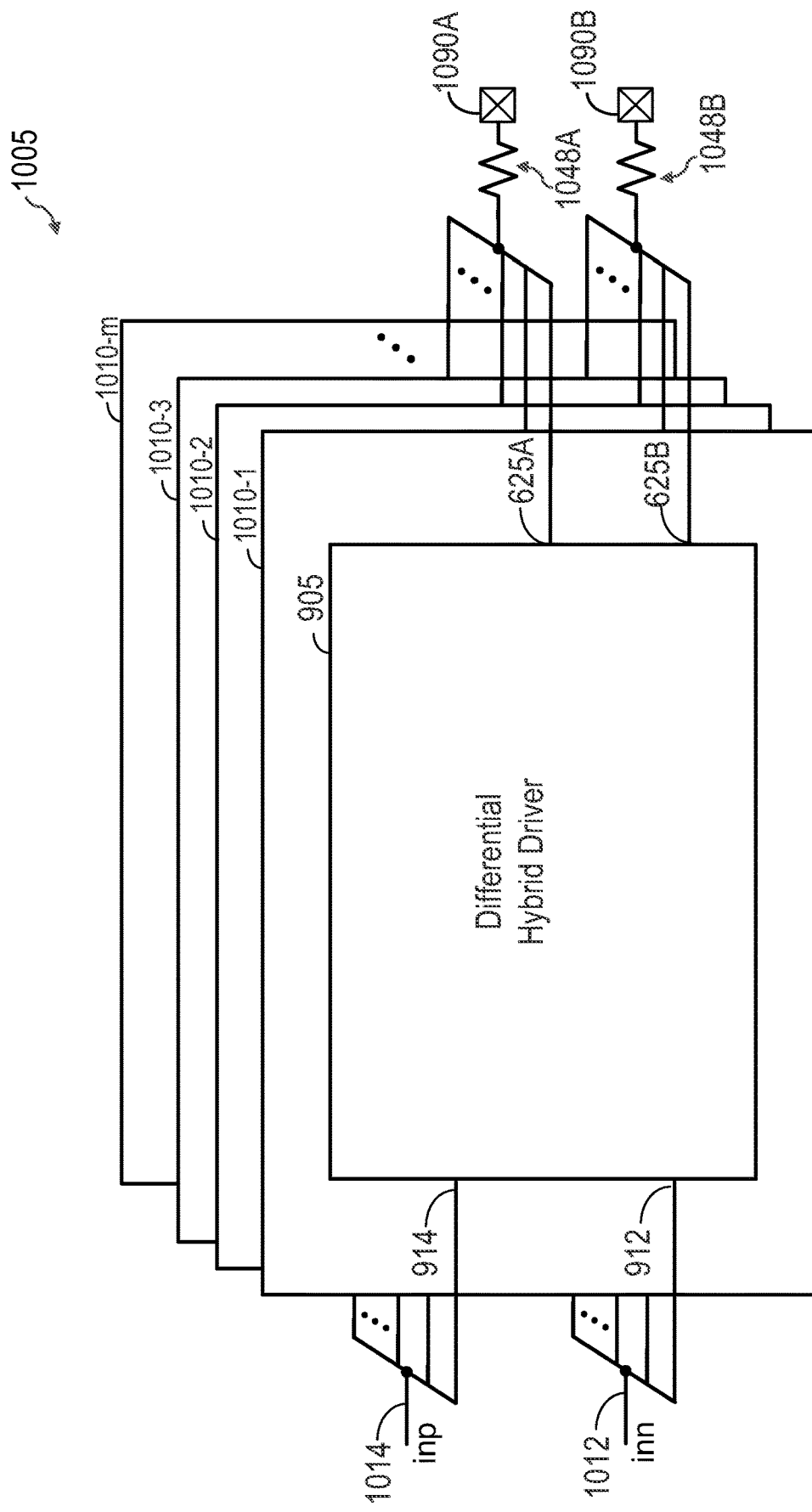
FIG. 10 shows an example of a differential hybrid driver including multiple slices according to certain aspects of the present disclosure.

The exemplary differential hybrid driver 905 shown in FIG. 9 may be used to implement a multi-slice hybrid driver 1005, an example of which is shown in FIG. 10. In this example, the multi-slice hybrid driver 1005 includes multiple slices 1010-1 to 1010-$m$ coupled in parallel between the first voltage rail 655 and the ground. Each of the slices 1010-1 to 1010-$m$ is implemented with the exemplary differential hybrid driver 905 shown in FIG. 9 (i.e., each of the slices 1010-1 to 1010-$m$ is a separate instance of the differential hybrid driver 905 shown in FIG. 9). Note that the details of the differential hybrid driver 905 are not shown in FIG. 10 for ease of illustration.

As shown in FIG. 10, the first outputs 625A of the slices 1010-1 to 1010-$m$ are coupled to a first output pin 1090A via a first resistor 1048A (i.e., the first resistor 1048A is coupled between the first outputs 625A of the slices 1010-1 to 1010-$m$ and the first output pin 1090A). The second outputs 625B of the slices 1010-1 to 1010-$m$ are coupled to a second output pin 1090B via a second resistor 1048B (i.e., the second resistor 1048B is coupled between the second outputs 625B of the slices 1010-1 to 1010-$m$ and the second output pin 1090B). The first output pin 1090A and the second output pin 1090B may be coupled to a differential link in which the first output pin 1090A is coupled to a first transmission line (e.g., transmission line 312$a$ or 314$a$) of the differential link and the second output pin 1090B is coupled to a second transmission line (e.g., transmission line 312$b$ or 314$b$) of the differential link.

The first inputs 912 of the slices 1010-1 to 1010-$m$ are coupled to a first input 1012 of the multi-slice hybrid driver 1005, and the second inputs 914 of the slices 1010-1 to 1010-$m$ are coupled to a second input 1014 of the multi-slice hybrid driver 1005. The first input 1012 and the second input 1014 are driven by complementary input signals inn and inp, respectively.

The switch control circuit 680 (shown in FIG. 9) controls the switches in the slices 1010-1 to 1010-$m$ to selectively operate the multi-slice hybrid driver 1005 in the N-over-N driver mode or the P-over-N driver mode. For example, the switch control circuit 680 may operate the multi-slice hybrid driver 1005 in the N-over-N driver mode when the regulated voltage Vreg is in the first regulated voltage range corresponding to the first amplitude range (e.g., 50 mV to 400 mV), and operate the multi-slice hybrid driver 1005 in the P-over-N driver mode when the regulated voltage Vreg is in the second regulated voltage range corresponding to the second amplitude range (e.g., 425 mV to 700 mV). Note that the voltage regulator 650 is not shown in FIG. 10.

In certain aspects, the number of the slices 1010-1 to 1010-$m$ that are active (i.e., enabled) at a given time may be adjusted (e.g., using switches). For example, the number of the slices 1010-1 to 1010-$m$ that are active (i.e., enabled) may be adjusted to adjust the output impedance at each output of the multi-slice hybrid driver 1005. In this example, the output impedance at each output of the multi-slice hybrid driver 1005 may be adjusted (i.e., calibrated) to provide impedance matching with the transmission line coupled to the respective one of the output pins 1090A and 1090B.

As discussed above, the voltage regulator 650 may be implemented with a low dropout (LDO) regulator. An LDO regulator typically includes one pass transistor and one error amplifier in which the output of the error amplifier drives the gate of the pass transistor based on a reference voltage and feedback of the regulated voltage. The pass transistor may be a pass NFET or a pass PFET.

Figure 11:
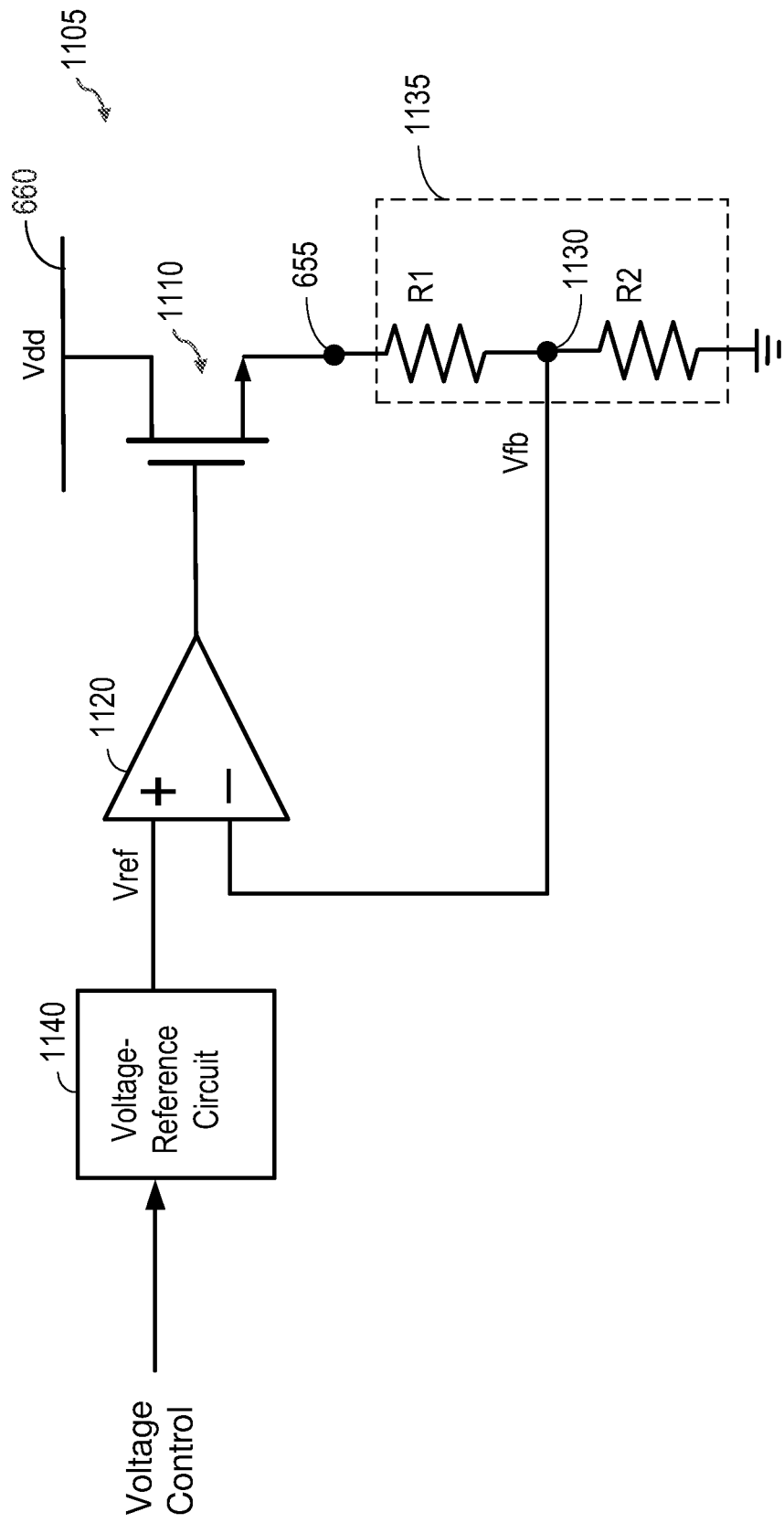
FIG. 11 shows a low dropout (LDO) regulator including a pass NFET according to certain aspects of the present disclosure.

FIG. 11 shows an example of an LDO regulator 1105 including a pass NFET 1110, an amplifier 1120, a voltage-reference circuit 1140, and a voltage divider 1135. The pass NFET 1110 is coupled between the first voltage rail 655 and the second voltage rail 660. The voltage divider 1135 includes a first resistor R1 and second resistor R2 coupled in series between the first voltage rail 655 and the ground. The voltage divider 1135 provides a feedback voltage Vfb at node 1130 given as follows:

$$Vfb = \left(\frac{R2}{R1+R2}\right) \cdot Vreg \qquad (1)$$

where R1 and R2 in equation (1) are the resistances of resistors R1 and R2, respectively. As shown in equation (1), the feedback voltage Vfb is proportional to the regulated voltage Vreg and thus provides feedback on the regulated voltage Vreg. The feedback voltage Vfb is feed to the minus input of the amplifier 1120. The voltage-reference circuit 1140 is configured to generate a reference voltage Vref that is input to the plus input of the amplifier 1120. The voltage-reference circuit 1140 is configured to set the voltage level of the reference voltage Vref based on the voltage control signal. As discussed further below, the regulated voltage Vreg is adjusted by adjusting the reference voltage Vref using the voltage control signal.

In operation, the amplifier 1120 receives the feedback voltage Vfb and the reference voltage Vref. The amplifier 1120 drives the gate of the pass NFET 1110 in a direction that reduces the difference between the reference voltage and the feedback voltage Vfb such that the regulated voltage Vreg on the first voltage rail 655 is approximately equal to:

$$Vreg = \left(1 + \frac{R1}{R2}\right) \cdot Vref \qquad (2)$$

As shown in equation (2), the regulated voltage Vreg is proportional to the reference voltage Vref. Thus, the voltage control signal may be used to adjust the regulated voltage Vreg by adjusting the reference voltage Vref generated by the voltage-reference circuit 1140.

The LDO regulator 1105 supports low regulated voltage levels which can be used to set the amplitude of a hybrid driver (e.g., hybrid driver 610, 805, 905 or 1005) low. However, the upper regulated voltage level of the regulator 1105 is limited. This is because the source of the pass NFET 1110 (which is coupled to the first voltage rail 655) needs to be below the gate voltage of the pass NFET 1110 by at least the threshold voltage of the pass NFET 1110 in order for the pass NFET 1110 to turn on. As a result, the LDO regulator 1105 may not be able to set the amplitude of the hybrid driver high, thereby reducing the amplitude range of the hybrid driver.

Figure 12:
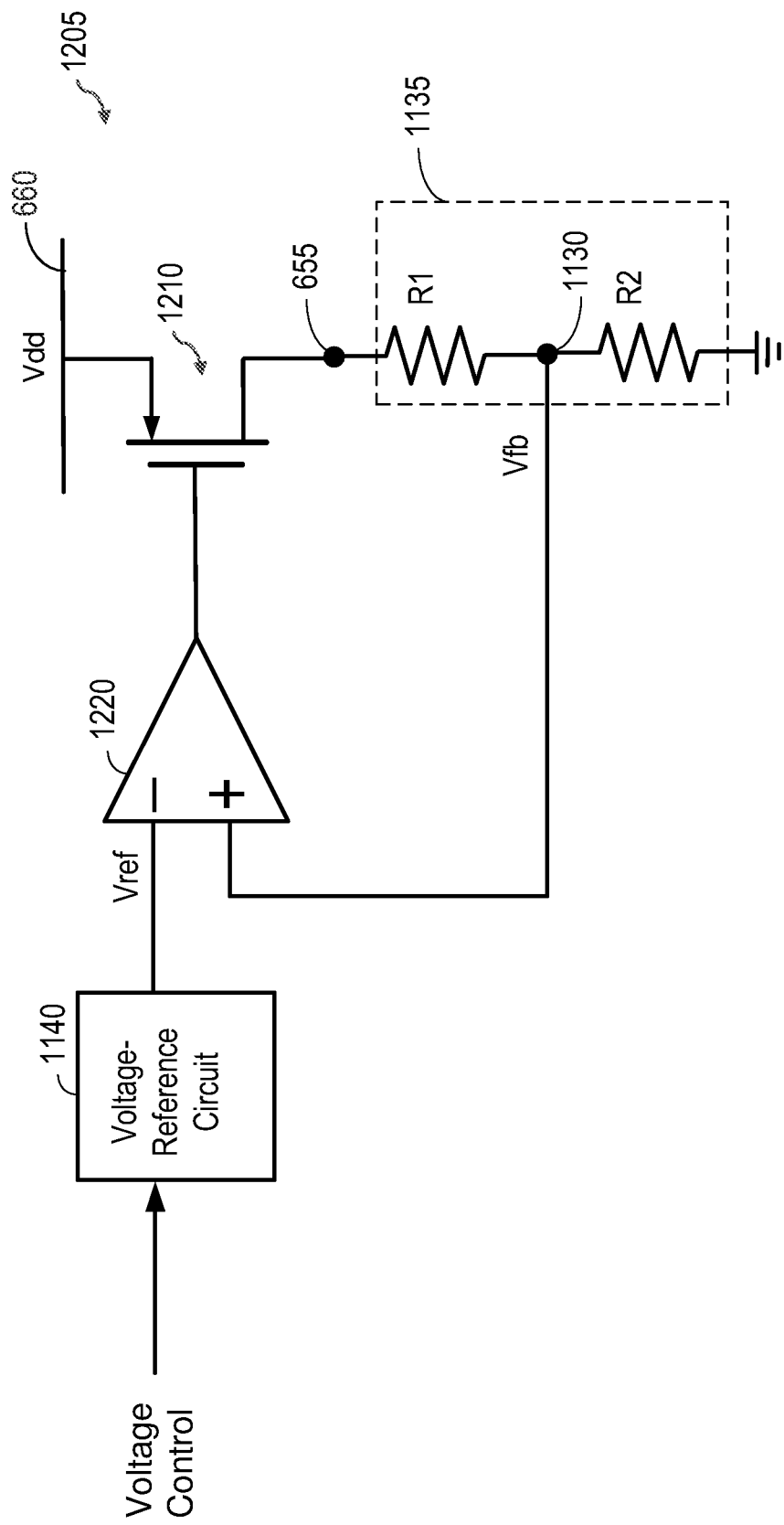
FIG. 12 shows an LDO regulator including a pass PFET according to certain aspects of the present disclosure.

FIG. 12 shows an example of an LDO regulator 1205 including a pass PFET 1210, an amplifier 1220, the voltage-reference circuit 1140, and the voltage divider 1135. The pass PFET 1210 is coupled between the first voltage rail 655 and the second voltage rail 660. In this example, the feedback voltage Vfb is input to the plus input of the amplifier 1220 and the reference voltage Vref from the voltage-reference circuit 1140 is input to the minus input of the amplifier 1220.

In operation, the amplifier 1220 receives the feedback voltage Vfb and the reference voltage Vref. The amplifier 1220 drives the gate of the pass PFET 1210 in a direction that reduces the difference between the reference voltage and the feedback voltage Vfb such that the regulated voltage Vreg on the first voltage rail 655 is proportional to the reference voltage Vref (e.g., based on equation (2)). Since the voltage control signal controls the reference voltage Vref generated by the voltage-reference circuit 1140, the voltage control signal may be used to adjust the regulated voltage Vreg by adjusting the reference voltage Vref.

The LDO regulator 1205 supports high regulated voltage levels which can be used to set the amplitude of a hybrid driver (e.g., hybrid driver 610, 805, 905 or 1005) high. However, the lower regulated voltage level of the LDO regulator 1205 is limited compared with the LDO regulator 1105 using the pass NFET 1110. As a result, the LDO regulator 1205 may not be able to set the amplitude of the hybrid driver low, thereby reducing the amplitude range of the hybrid driver.

To address the limitations of the LDO regulators 1105 and 1205, aspects of the present disclosure provide a hybrid LDO regulator that combines a pass NFET and a pass PFET to achieve a wide regulated voltage range, as discussed further below.

Figure 13:
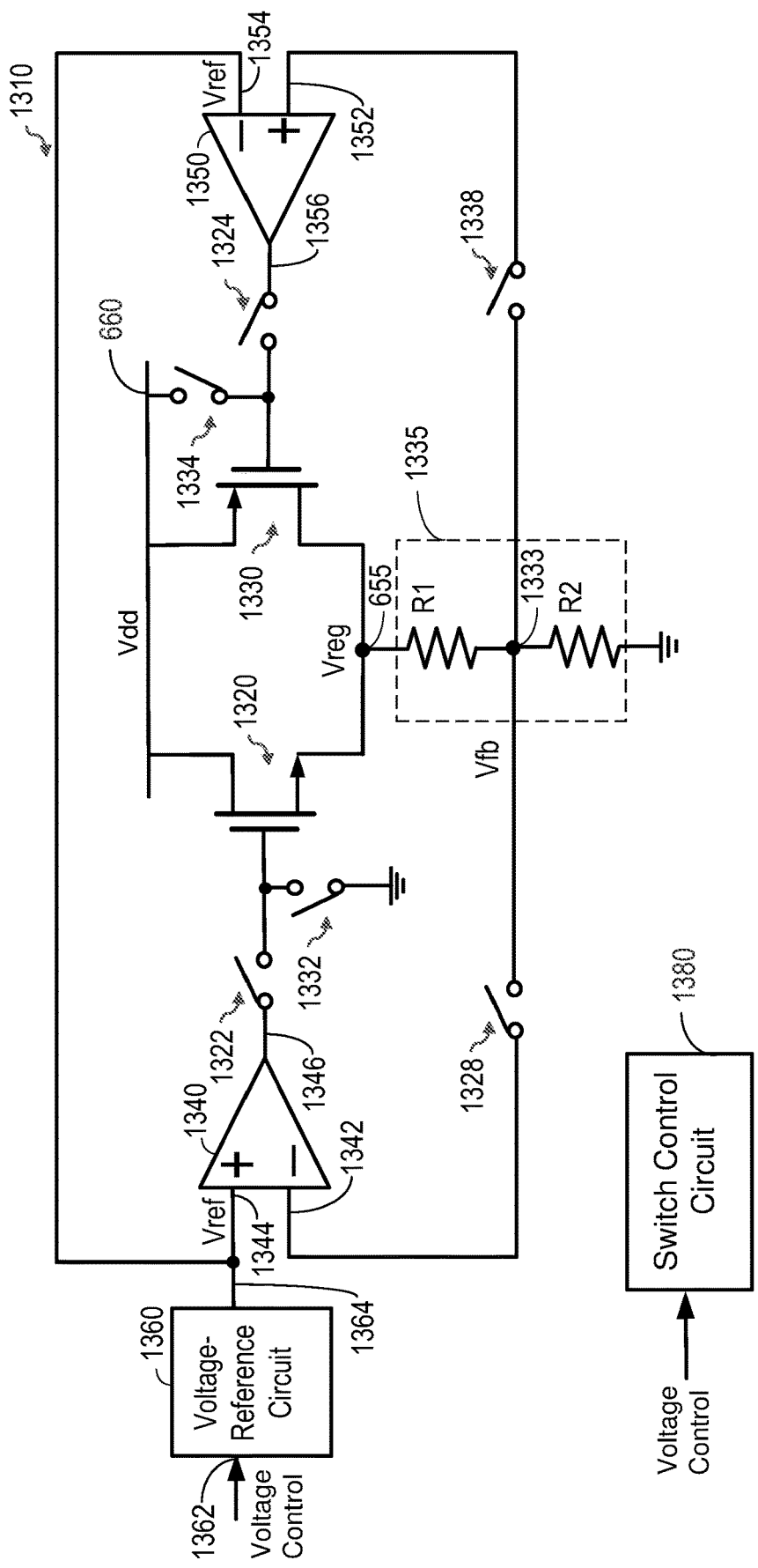
FIG. 13 shows an example of a hybrid LDO regulator including a pass NFET and a pass PFET according to certain aspects of the present disclosure.

FIG. 13 shows an example of a hybrid LDO regulator 1310 according to aspects of the present disclosure. The hybrid LDO regulator 1310 may be used to implement the voltage regulator 650. The hybrid LDO regulator 1310 is configured to generate the regulated voltage Vreg on the first voltage rail 655 from the supply voltage Vdd on the second voltage rail 660. The first voltage rail 655 may be coupled to the hybrid driver 610, 805, 905 or 1005, as discussed above.

The hybrid LDO regulator 1310 includes a pass NFET 1320, a pass PFET 1330, a first amplifier 1340, a second amplifier 1350, a first switch 1322, a second switch 1324, a third switch 1332, a fourth switch 1334, a fifth switch 1328, a sixth switch 1338, a voltage divider 1335, and a voltage-reference circuit 1360. The pass NFET 1320 is coupled between the first voltage rail 655 and the second voltage rail 660 with the drain of the pass NFET 1320 coupled to the second voltage rail 660 and the source of the pass NFET 1320 coupled to the first voltage rail 655. The pass PFET 1330 is coupled between the first voltage rail 655 and the second voltage rail 660 with the source of the pass PFET 1330 coupled to the second voltage rail 660 and the drain of the pass PFET 1330 coupled to the first voltage rail 655. Each of the first amplifier 1340 and the second amplifier 1350 may be a single stage or a multiple stage amplifier. Also, each of the first amplifier 1340 and the second amplifier 1350 may be implemented with a cascode amplifier, folded cascode amplifier, or another type of amplifier.

The voltage divider 1335 includes a first resistor R1 and second resistor R2 coupled in series between the first voltage rail 655 and the ground. The voltage divider 1335 provides a feedback voltage Vfb at feedback node 1333 given by equation (1) provided above.

The first switch 1322 is coupled between the output 1346 of the first amplifier 1340 and the gate of the pass NFET 1320, the second switch 1324 is coupled between the output of the second amplifier 1350 and the gate of the pass PFET 1330, the third switch 1332 is coupled between the gate of the pass NFET 1320 and the ground, and the fourth switch 1334 is coupled between the gate of the pass PFET 1330 and the second voltage rail 660. Also, the fifth switch 1328 is coupled between the feedback node 1333 and a first input 1342 of the first amplifier 1340, and the sixth switch 1338 is coupled between the feedback node 1333 and a first input 1352 of the second amplifier 1350.

The voltage-reference circuit 1360 is configured to receive the voltage control signal at input 1362 (e.g., from the voltage control circuit 695 shown in FIG. 6) and generate the reference voltage Vref at output 1364 based on the received voltage control signal. In certain aspects, the voltage-reference circuit 1360 is configured to set the voltage level of the reference voltage Vref based on the voltage control signal. For the example in which the voltage control signal is a digital signal, the voltage-reference circuit 1360 may have multiple selectable reference voltage levels where each of the selectable reference voltage levels corresponds to a different value of the control signal. In this example, the voltage-reference circuit 1360 sets the voltage level of the reference voltage Vref to the one of the selectable reference voltage levels corresponding to the current value of the control signal. As discussed further below, the regulated voltage Vreg is adjusted by adjusting the reference voltage Vref using the voltage control signal. The regulated voltage Vreg may be related to the reference voltage Vref according to equation (2) provided above. For the example where the voltage control signal is a digital signal (also referred to as a digital code), the voltage-reference circuit 1360 may be implemented with a digital-to-analog converter (DAC). Exemplary implementations of the voltage-reference circuit 1360 are discussed below.

The output 1364 of the voltage-reference circuit 1360 is coupled to a second input 1344 of the first amplifier 1340 and a second input 1354 of the second amplifier 1350. Thus, the reference voltage Vref is input to the second input 1344 of the first amplifier 1340 and the second input 1354 of the second amplifier 1350.

As discussed further below, the switches 1322, 1324, 1328, 1332, 1334 and 1338 are configured to switch the hybrid LDO regulator 1310 between a first regulation mode and a second regulation mode. In the first regulation mode, the pass NFET 1320 is used as the pass transistor of the hybrid LDO regulator 1310 with the pass PFET 1330 turned off, and, in a second regulation mode, the pass PFET 1330 is used as the pass transistor of the hybrid LDO regulator 1310 with the pass NFET 1320 turned off. In one example, the hybrid LDO regulator 1310 may be operated in the first regulation mode when the regulated voltage is in a first regulated voltage range and operated in the second regulation mode when the regulated voltage is in a second regulated voltage range. In this example, the regulated voltage range of the hybrid LDO regulator 1310 is a combination of the first regulated voltage range and the second regulated voltage range, which allows the hybrid LDO regulator 1310 to achieve a wide regulated voltage range, as discussed further below.

A switch control circuit 1380 controls the switches 1322, 1324, 1328, 1332, 1334 and 1338 to selectivity operate the hybrid LDO regulator 1310 in the first regulation mode or the second regulation node (e.g., based on the voltage control signal). For ease of illustration, the individual connections between the switch control circuit 1380 and the switches 1322, 1324, 1328, 1332, 1334 and 1338 are not explicitly shown in FIG. 13. In some implementations, the switch control circuit 1380 may be the same as the switch control circuit 680 used to control the driver mode of the hybrid driver 610, 805, 905 or 1005, as discussed further below.

To operate the hybrid LDO regulator 1310 in the first regulation mode, the switch control circuit 1380 turns on the first switch 1322, turns off the second switch 1324, turns off the third switch 1332, and turns on the fourth switch 1334. This couples the output of the first amplifier 1340 to the gate of the pass NFET 1320 and turns off the pass PFET 1330. Also, the switch control circuit 1380 turns on the fifth switch 1328 and turns off the sixth switch 1338. This couples the feedback node 1333 to the first input 1342 of the first amplifier 1340 and decouples the feedback node 1333 from the first input 1352 of the second amplifier 1350.

In the first regulation mode, the first amplifier 1340 receives the feedback voltage Vfb at the first input 1342 and the reference voltage Vref at the second input 1344. The first amplifier 1340 drives the gate of the pass NFET 1320 in a direction that reduces the difference between the reference voltage and the feedback voltage Vfb such that the regulated voltage Vreg on the first voltage rail 655 is approximately proportional to the reference voltage Vref (e.g., based on equation (2)). Since the reference voltage Vref is controlled by the voltage control signal and the regulated voltage Vreg is proportional to the reference voltage Vref, the voltage control signal can be used to adjust the regulated voltage Vreg. In the first regulation mode, the pass NFET 1320 allows the hybrid LDO regulator 1310 to achieve a low regulated voltage with high supply noise rejection.

To operate the hybrid LDO regulator 1310 in the second regulation mode, the switch control circuit 1380 turns off the first switch 1322, turns on the second switch 1324, turns on the third switch 1332, and turns off the fourth switch 1334. This couples the output of the second amplifier 1350 to the gate of the pass PFET 1330 and turns off the pass NFET 1320. Also, the switch control circuit 1380 turns off the fifth switch 1328 and turns on the sixth switch 1338. This couples the feedback node 1333 to the first input 1352 of the second amplifier 1350 and decouples the feedback node 1333 from the first input 1342 of the first amplifier 1340.

In the second regulation mode, the second amplifier 1350 receives the feedback voltage Vfb at the first input 1352 and the reference voltage Vref at the second input 1354. The second amplifier 1350 drives the gate of the pass PFET 1330 in a direction that reduces the difference between the reference voltage and the feedback voltage Vfb such that the regulated voltage Vreg on the first voltage rail 655 is approximately proportional to the reference voltage Vref (e.g., based on equation (2)). Since the reference voltage Vref is controlled by the voltage control signal and the regulated voltage Vreg is proportional to the reference voltage Vref, the voltage control signal can be used to adjust the regulated voltage Vreg. In the second regulation mode, the pass PFET 1330 allows the hybrid LDO regulator 1310 to achieve a high regulated voltage (e.g., close to Vdd).

As discussed above, the switch control circuit 1380 may operate the hybrid LDO regulator 1310 in the first regulation mode or the second regulation mode based on the voltage control signal. In this regard, FIG. 13 shows an example in which the voltage control signal is input to the switch control circuit 1380. In this example, the switch control circuit 1380 operates hybrid LDO regulator 1310 in the first regulation mode when the voltage control signal sets the regulated voltage Vreg to a voltage level within a first regulated voltage range, and operates hybrid LDO regulator 1310 in the second regulation mode when the voltage control signal sets the regulated voltage Vreg to a voltage level within a second regulated voltage range. In one example, the first regulated voltage range corresponds to the first amplitude range (e.g., 50 mV to 400 mV) of the hybrid driver 610, 805, 905 or 1005, and the second regulated voltage range corresponds to the second amplitude range (e.g., 425 mV to 700 mV) of the hybrid driver 610, 805, 905 or 1005. In this example, the switch control circuit 1380 operates the hybrid LDO regulator 1310 in the first regulation mode when the hybrid driver 610, 805, 905 or 1005 is in the N-over-N driver mode, and operates the hybrid LDO regulator 1310 in the second regulation mode when the hybrid driver 610, 805, 905 or 1005 is in the P-over-N driver mode. Thus, in this example, the first regulation mode coincides with the N-over-N driver mode and the second regulation mode coincides with the P-over-N driver mode, which allows the regulation mode of the hybrid LDO regulator 1310 and the driver mode of the hybrid driver to be controlled by the same switch control circuit. Accordingly, in this example, the switch control circuit 1380 may be the same as the switch control circuit 680 used to control the driver mode of the hybrid driver 610, 805, 905 or 1005. However, it is to be appreciated that the present disclosure is not limited to this example.

In certain aspects, the voltage control signal is a digital signal (also referred to as a digital code) in which the voltage level of the regulated voltage Vreg is set by the value of the voltage control signal. In one example, a first set of values for the voltage control signal corresponds to voltage levels within the first regulated voltage range and a second set of values for the voltage control signal corresponds to voltage levels within the second regulated voltage range. In this example, the switch control circuit 1380 may be configured to operate the hybrid LDO regulator 1310 in the first regulation mode if the current value of the voltage control signal is in the first set of values, and operate the hybrid LDO regulator 1310 if the current value of the voltage control signal is in the second set of values. The switch control circuit 1380 may also be configured to operate the hybrid driver 610, 805, 905 or 1005 in the N-over-N driver mode if the current value of the voltage control signal is in the first set of values, and operate the hybrid driver in the P-over-N driver mode if the current value of the voltage control signal is in the second set of values.

Although the hybrid LDO regulator 1310 is discussed above using the example in which the hybrid LDO regulator 1310 provides the regulated voltage Vreg to a hybrid driver, it is to be appreciated that the hybrid LDO 1310 is not limited to this example. The hybrid LDO regulator 1310 may be used in other applications where it is desirable to provide a regulated voltage that can be adjusted over a wide voltage range.

Figure 14:
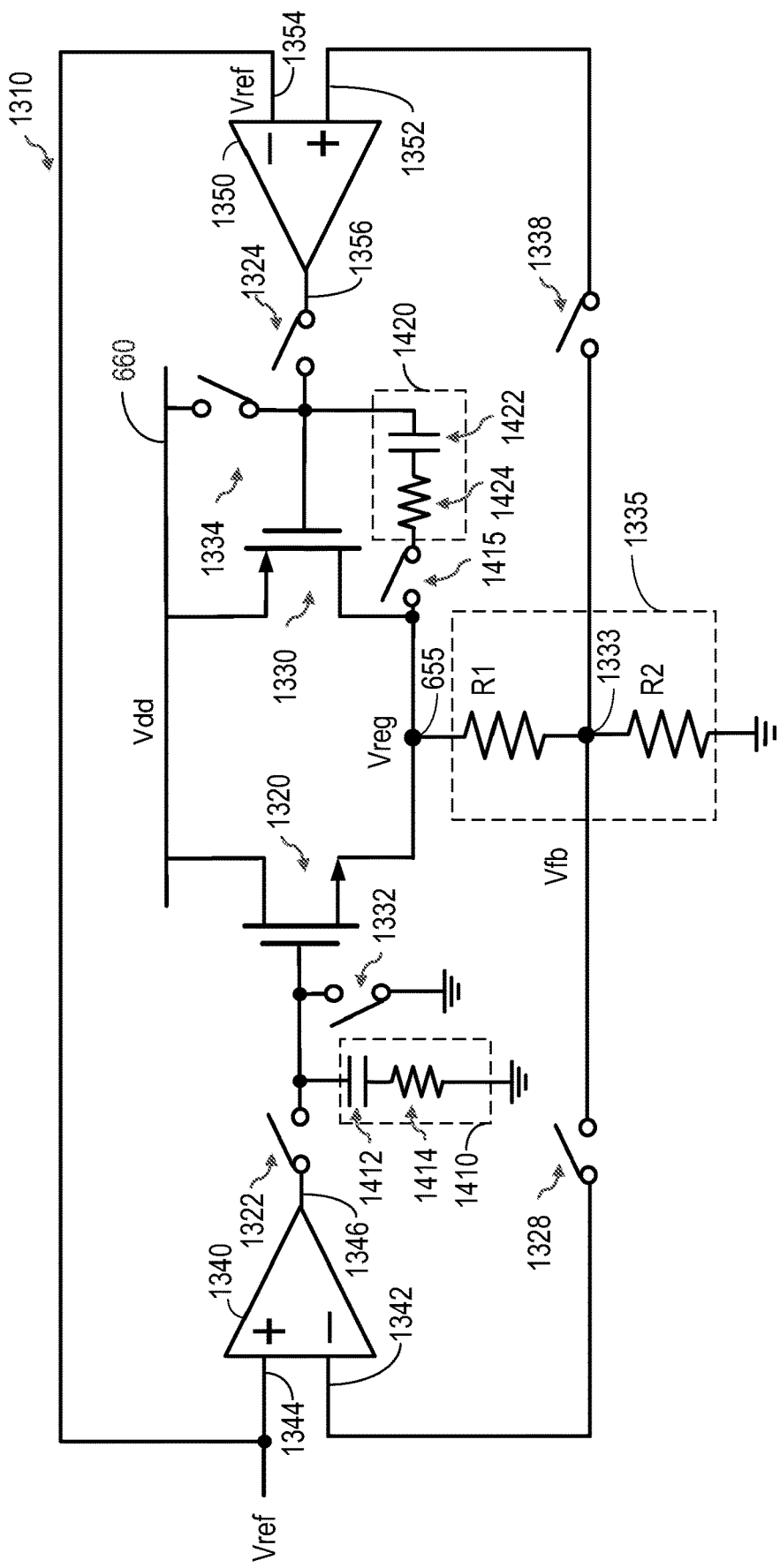
FIG. 14 shows an example of a hybrid LDO regulator including compensation circuits according to certain aspects of the present disclosure.

FIG. 14 shows an example of the hybrid LDO regulator 1310 further including a first compensation circuit 1410, a seventh switch 1415, and a second compensation circuit 1420. The first compensation circuit 1410 is coupled between the gate of the pass NFET 1320 and the ground. In the example in FIG. 14, the first compensation circuit 1410 includes a resistor 1414 and a compensation capacitor 1412 coupled in series. The first compensation circuit 1410 may be configured to provide loop compensation to increase the phase margin and loop stability of the LDO regulator 1310 in the first regulation mode.

The second compensation circuit 1420 is coupled between the gate of the pass PFET 1330 and the seventh switch 1415, and the seventh switch 1415 is coupled between the second compensation circuit 1420 and the drain of the pass PFET 1330. In the example in FIG. 14, the second compensation circuit 1420 includes a resistor 1424 and a compensation capacitor 1422 coupled in series.

The switch control circuit 1380 (shown in FIG. 13) may be configured to turn off the seventh switch 1415 in the first regulation mode and turn on the seventh switch 1415 in the second regulation mode. Thus, in this example, the second compensation circuit 1420 is coupled between the gate of the pass PFET 1330 and the drain of the pass PFET 1330 in the second regulation mode to provide Miller compensation for improved loop stability.

Thus, in this example, separate compensation circuits (i.e., the first compensation circuit 1410 and the second compensation circuit 1420) are used for the first regulation mode and the second regulation mode instead of a shared compensation circuit for both regulation modes. This allows the compensation schemes for the first regulation mode and the second regulation mode to be independently designed to provide good loop stability for the first regulation mode and good loop stability for the second regulation mode.

Figure 15:
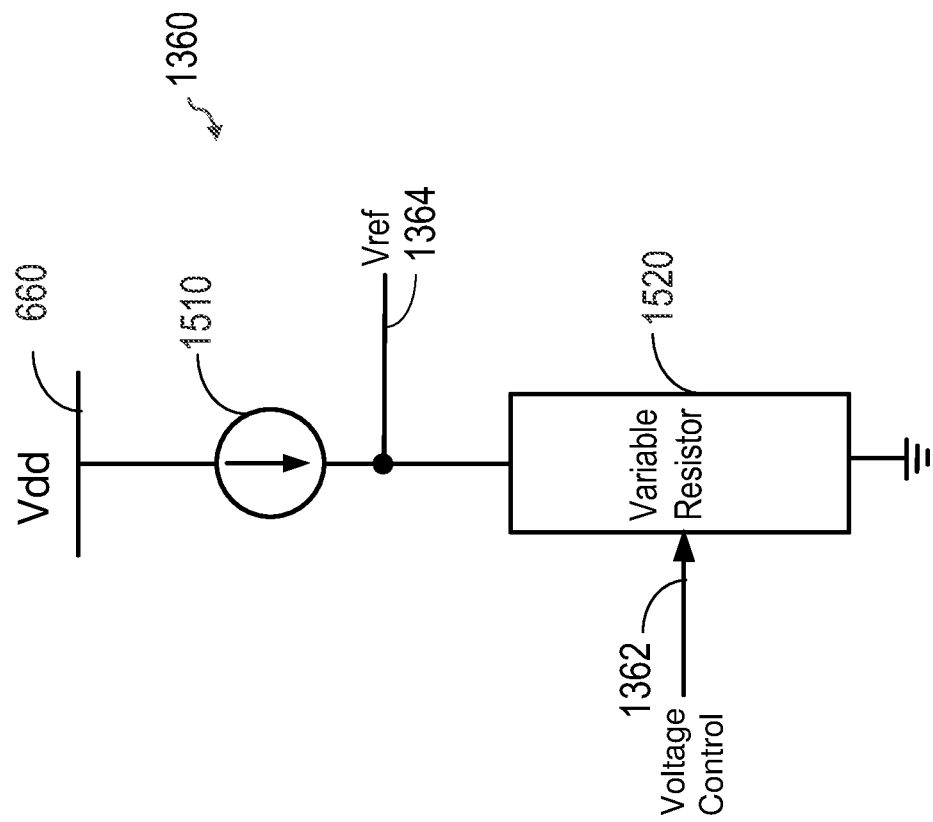
FIG. 15 shows an exemplary implementation of a voltage-reference circuit according to certain aspects of the present disclosure.

FIG. 15 shows an exemplary implementation of the voltage-reference circuit 1360 according to certain aspects of the present disclosure. In this example, the voltage-reference circuit 1360 includes a current source 1510 and a variable resistor 1520. The current source 1510 is coupled between the second voltage rail 660 and the output 1364 of the voltage-reference circuit 1360, and the variable resistor 1520 is coupled between the output 1364 of the voltage-reference circuit 1360 and the ground.

In this example, variable resistor 1520 has a digitally controlled resistance that is controlled by the voltage control signal received at the input 1362. The variable resistor 1520 may include multiple resistors and multiple switches where the switches control which of the resistors contribute to the resistance of the variable resistor 1520 at a given time. In this example, each of the switches may be controlled by a respective bit of the voltage control signal. In this example, the reference voltage Vref is given by $$Vref = I \cdot Rv \tag{3}$$

where I is the current of the current source 1510 and Rv is the resistance of the variable resistor 1520. As shown in equation (3), the voltage control signal controls the reference voltage by controlling the resistance of the variable resistor 1520.

Figure 16:
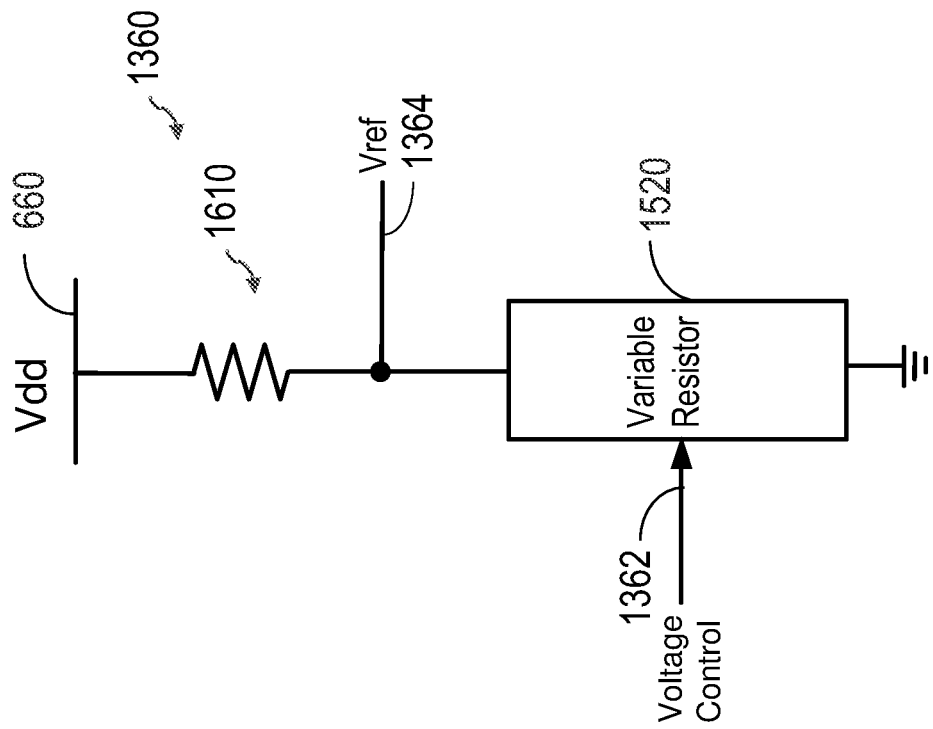
FIG. 16 shows another exemplary implementation of a voltage-reference circuit according to certain aspects of the present disclosure.

FIG. 16 shows another exemplary implementation of the voltage-reference circuit 1360 according to certain aspects of the present disclosure. In this example, the voltage-reference circuit 1360 includes a reference resistor 1610 and the variable resistor 1520. The reference resistor 1610 is coupled between the second voltage rail 660 and the output 1364 of the voltage-reference circuit 1360, and the variable resistor 1520 is coupled between the output 1364 of the voltage-reference circuit 1360 and the ground. The reference resistor 1610 may have a fixed resistance.

As discussed above, the variable resistor 1520 has a digitally controlled resistance that is controlled by the voltage control signal received at the input 1362. In this example, the reference voltage Vref is given by $$Vref = \left(\frac{Rv}{Rf + Rv}\right) \cdot Vdd \tag{4}$$

where Rf is the resistance of the reference resistor 1610 and Rv is the resistance of the variable resistor 1520. As shown in equation (4), the voltage control signal controls the reference voltage by controlling the resistance of the variable resistor 1520.

Figure 17:
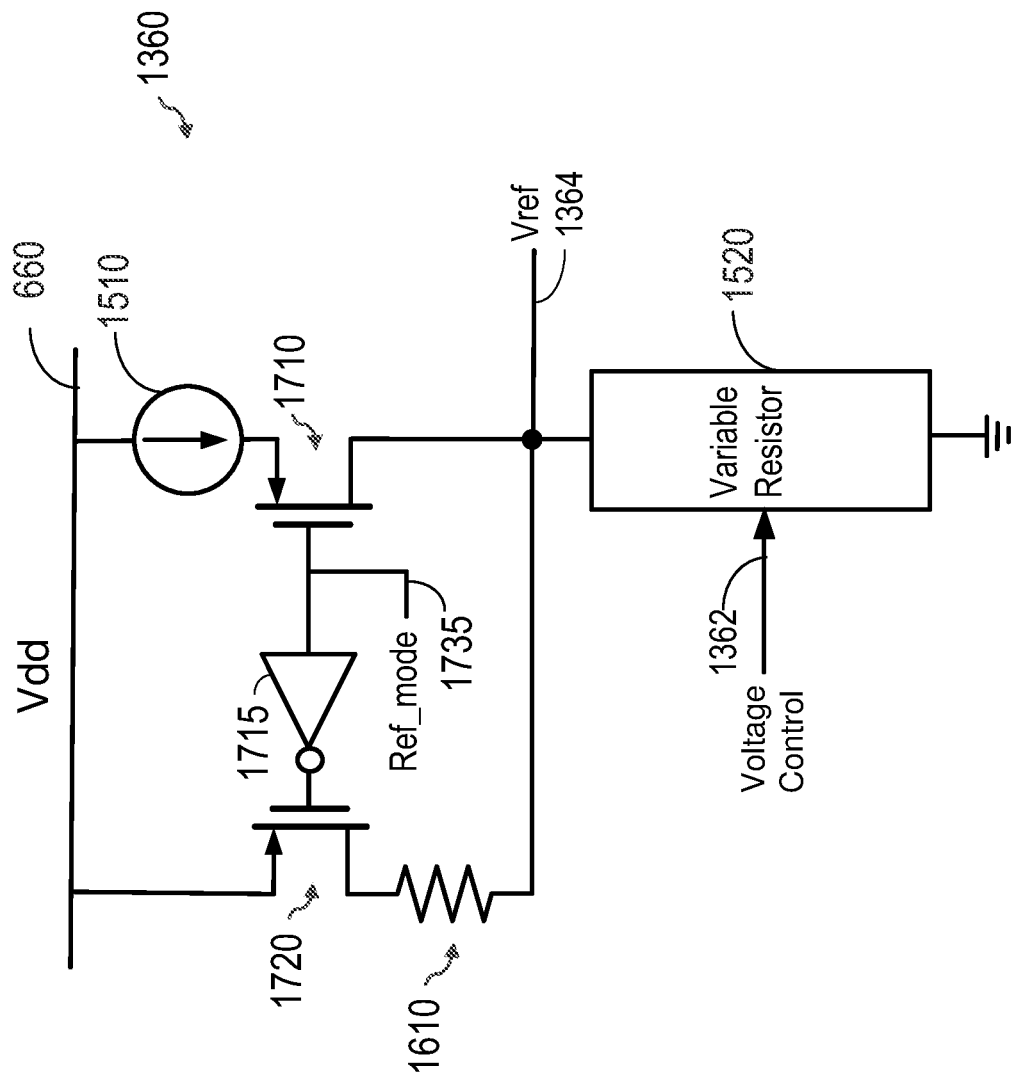
FIG. 17 shows yet another exemplary implementation of a voltage-reference circuit according to certain aspects of the present disclosure.

FIG. 17 shows an exemplary implementation of the voltage-reference circuit 1360 that combines elements of the exemplary implementations shown in FIG. 15 and FIG. 16 according to certain aspects of the present disclosure. In this example, the voltage-reference circuit 1360 includes the current source 1510, the reference resistor 1610, the variable resistor 1520, a first transistor 1710, a second transistor 1720, and an inverter 1715. In the example in FIG. 17, each of the first transistor 1710 and the second transistor 1720 is implemented with a PFET.

The current source 1510 is coupled between the second voltage rail 660 and the first transistor 1710, and the first transistor 1710 is coupled between the current source 1510 and the output 1364 of the voltage-reference circuit 1360. The second transistor 1720 is coupled between the second voltage rail 660 and the reference resistor 1610, and the reference resistor 1610 is coupled between the second transistor 1720 and the output 1364 of the voltage-reference circuit 1360. The variable resistor 1520 is coupled between the output 1364 of the voltage-reference circuit 1360 and the ground.

The gate of the first transistor 1710 is coupled to a reference mode select input 1735.

The input of the inverter 1715 is coupled to the reference mode select input 1735, and the output of the inverter 1715 is coupled to the gate of the second transistor 1720.

The voltage-reference circuit 1360 is configured to operate in a first reference mode or a second reference mode based on a reference mode select signal (labeled "Ref mode") received at the reference mode select input 1735. In the example in FIG. 17, the voltage-reference circuit 1360 operates in the first reference mode when the reference mode select signal is low. In this case, the first transistor 1710 turns on and the second transistor 1720 turns off. This causes the first transistor 1710 to couple the current source 1510 to the variable resistor 1520. In this mode, the reference voltage Vref is given by equation (3). The voltage-reference circuit 1360 operates in the second reference mode when the reference mode select signal is high. In this case, the first transistor 1710 turns off and the second transistor 1720 turns on. This causes the second transistor 1720 to couple the reference resistor 1610 between the second voltage rail 660 and the variable resistor 1520. In this mode, the reference voltage Vref is given by equation (4).

Figure 18:
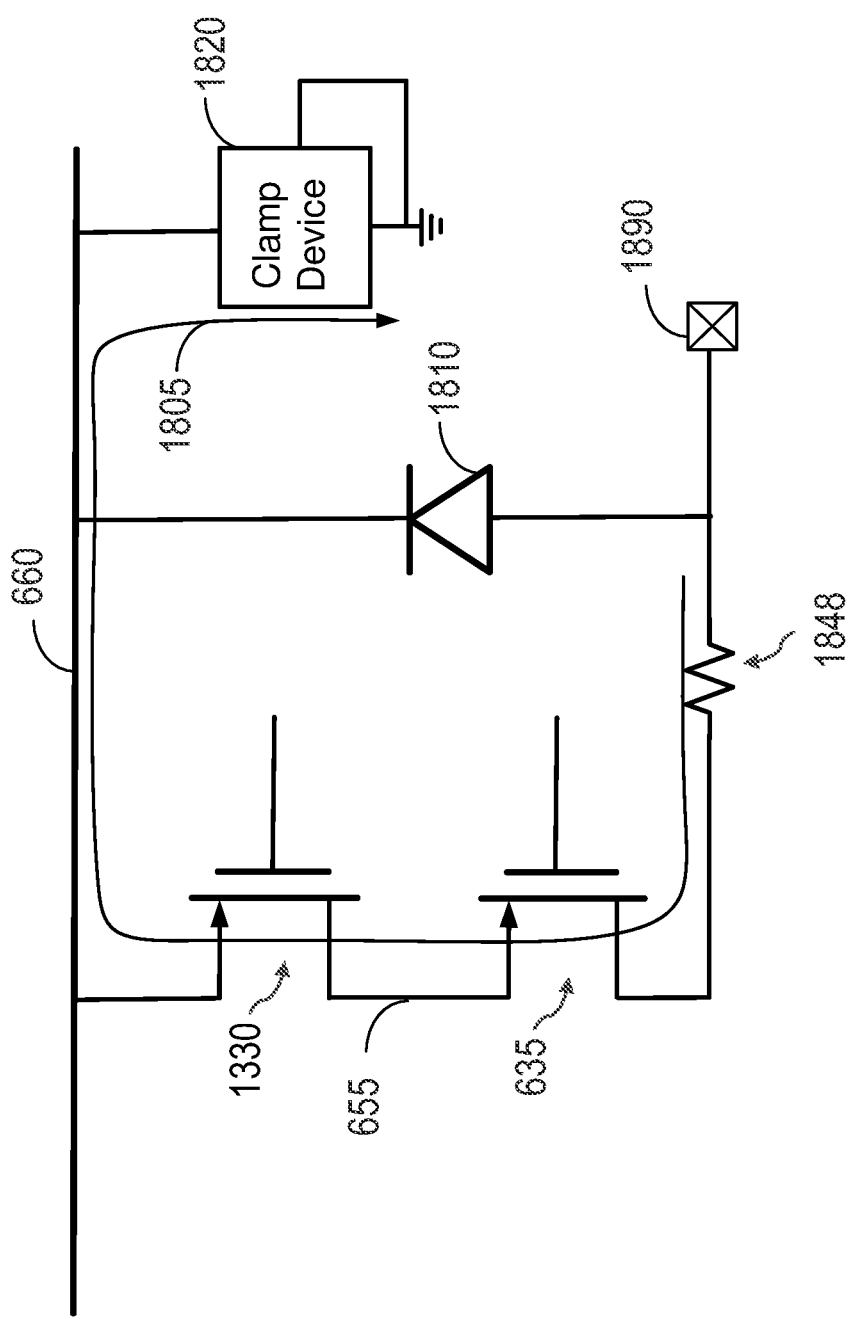
FIG. 18 shows an example of an electrostatic discharge path through a hybrid driver and a hybrid LDO regulator according to certain aspects of the present disclosure.

The exemplary hybrid driver 610, 805, 905 or 1005 and the hybrid LDO regulator 1310 provide ESD robustness, as discussed further below. ESD may occur when static charge is unintentionally transferred to an output pin 1890 of a chip (e.g., chip 110 or 120) from an external source (e.g., during handling of the chip), as shown in FIG. 18. The output pin 1890 may correspond to output pin 690, 890, 990A, 990B, 1090A or 1090B. The resistor 1848 coupled to the output pin 1890 may correspond to resistor 648, 848, 948A, 948B, 1048A or 1048B.

Referring to FIG. 18, the chip may include a diode 1810 and a clamp device 1820 to provide ESD protection. The diode 1810 is coupled between the output pin 1890 and the second voltage rail 660 and the clamp device 1820 is coupled between the second voltage rail 660 and the ground. The clamp device 1820 may include a clamp transistor and an RC transient detector in which the RC transient detector is configured to detect an ESD event and turn on the clamp transistor when the ESD event is detect to provide a discharge path to the ground. In this example, during an ESD event, the diode 1810 and the clamp device 1820 provide a discharge path from the output pin 1890 to the ground to discharge the static charge on the output pin 1890.

However, the voltage on the output pin 1890 may still reach a large voltage, which can cause transistors coupled to the output pin 1890 to develop large gate-to-drain voltages which can damage the transistors. To prevent this, the one or more pull-up PFETs 635 in the hybrid driver 610, 805, 905 or 1005 and the pass PFET 1330 in the hybrid LDO regulator 1310 turn on during an ESD event, creating a discharge path 1805 through the hybrid driver and the hybrid LDO regulator. This assumes that the gates of the PFETs drift towards ground when the power is off such that the PFETs turn on during the ESD event. The corresponding discharge current passes through the resistor 1848, resulting in an IR voltage drop across the resistor 1848. The IR voltage drop across the resistor 1848 reduces the voltage that the transistors in the hybrid driver and hybrid LDO regulator are exposed to during the ESD event, which reduces the gate-to-drain voltages of the transistors in the hybrid driver and hybrid LDO regulator, thereby providing more ESD robustness. Note that only the transistors of the hybrid driver and the hybrid LDO regulator in the discharge path 1805 are shown in FIG. 18 for ease of illustration.

Figure 19A:
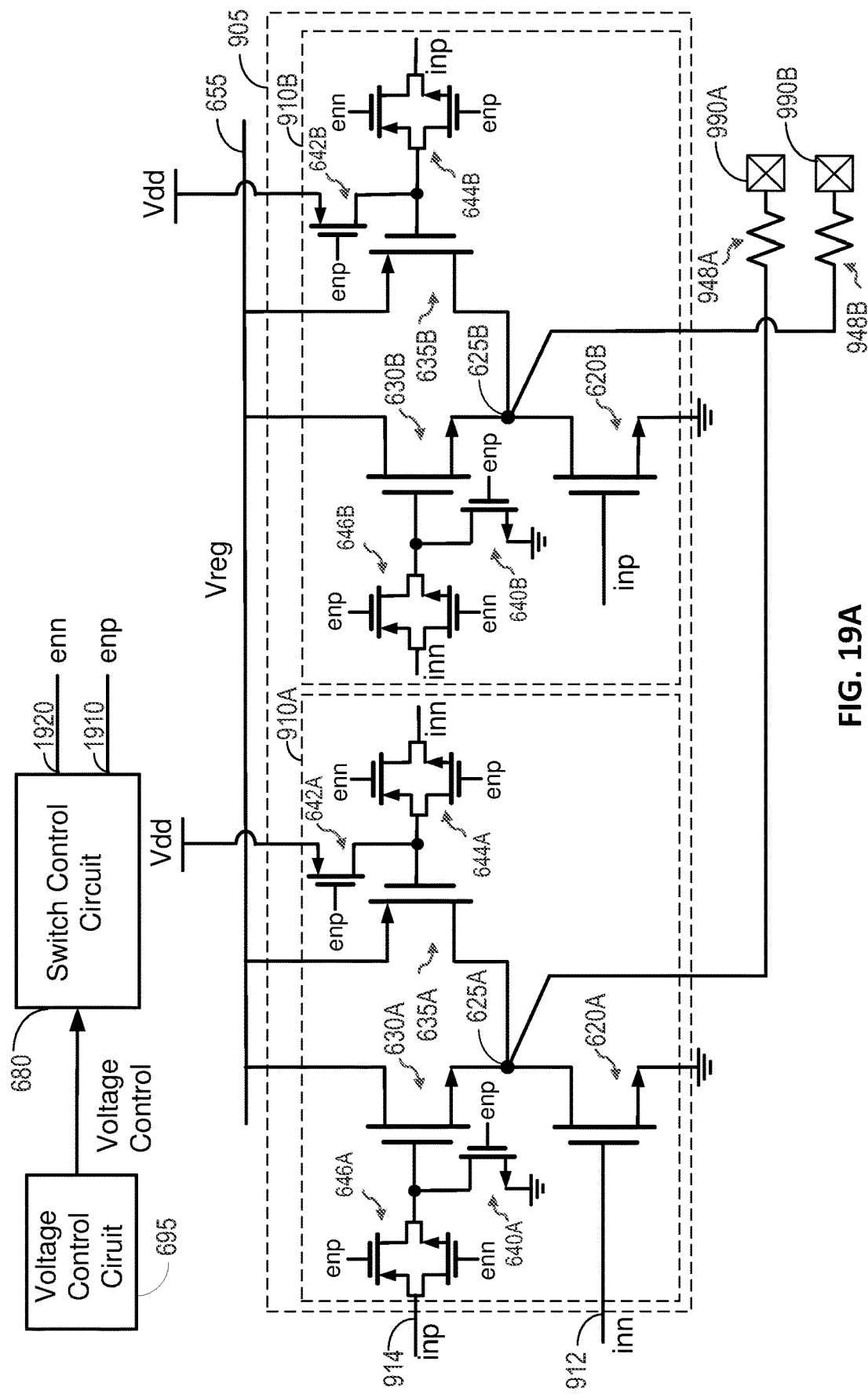
FIG. 19A shows an exemplary implementation of a hybrid driver according to certain aspects of the present disclosure.
Figure 19B:
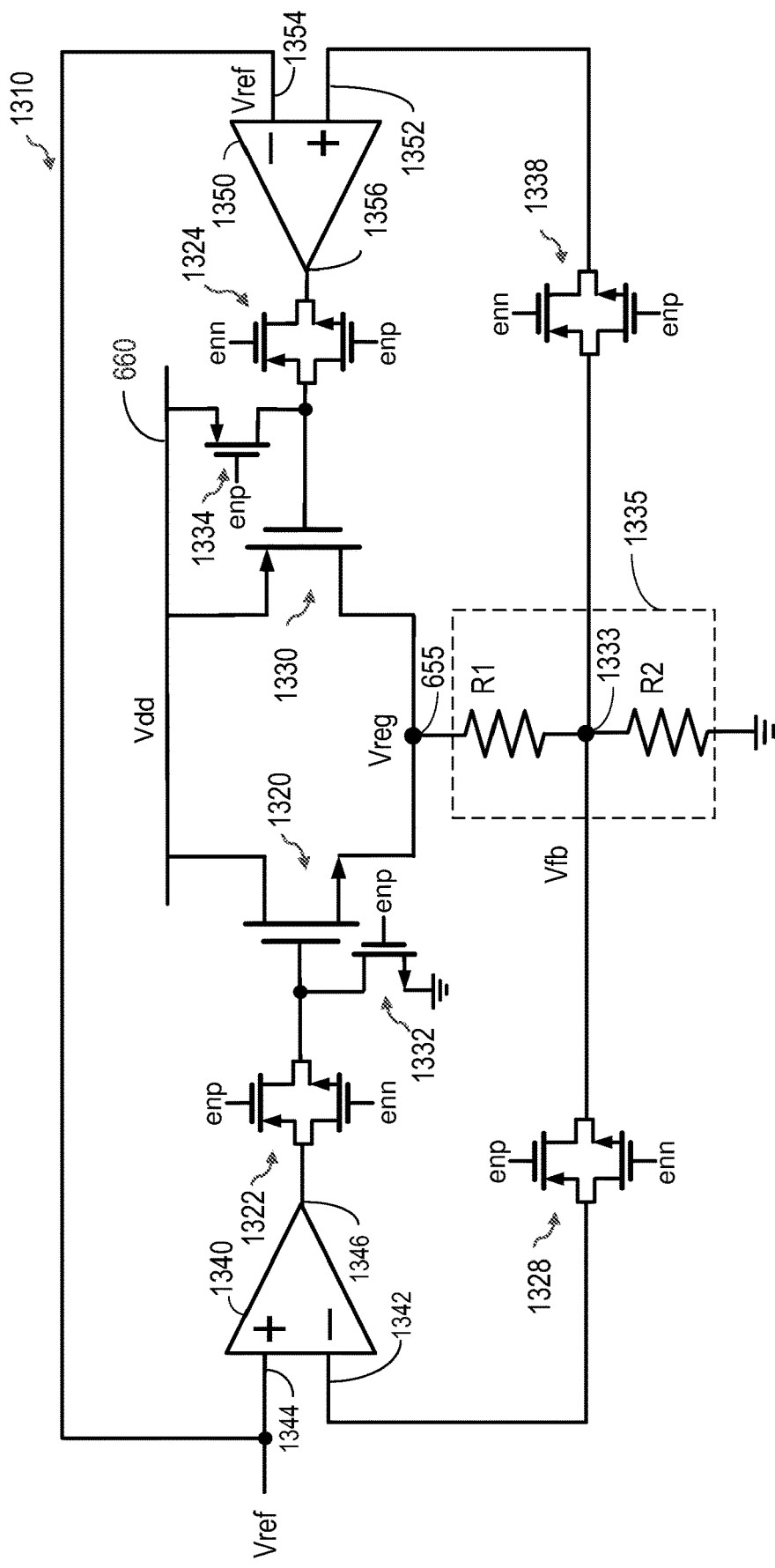
FIG. 19B shows an exemplary implementation of a hybrid LDO regulator controlled by a same set of control signals as the hybrid driver in FIG. 19A according to certain aspects of the present disclosure.

As discussed above, the first regulation mode of the hybrid LDO regulator 1310 may coincide with the N-over-N driver mode of the hybrid driver 610, 805, 905 or 1005 and the second regulation mode of the hybrid LDO regulator 1310 may coincide with the P-over-N driver mode of the hybrid driver 610, 805, 905 or 1005. This allows the regulation mode of the hybrid LDO regulator 1310 and the driver mode of the hybrid driver to be controlled by the same switch control circuit. An example of this is illustrated in FIGS. 19A and 19B, in which FIG. 19A shows an exemplary implementation of the hybrid driver 905 and FIG. 19B shows an exemplary implementation of the hybrid LDO regulator 1310 according to certain aspects. In this example, the switch control circuit 680 generates control signal enp at output 1910 and control signal enn at output 1920 based on the voltage control signal (e.g., from the voltage control circuit 695). The control signals enp and enn are used to control the driver mode of the hybrid driver 905 and the regulation mode of the hybrid LDO regulator 1310. Thus, in this example, the driver mode of the hybrid driver 905 and the regulation mode of the hybrid LDO regulator 1310 are controlled by the same set of control signals enp and enn.

In the example in FIG. 19A, switch 640A is implemented with an NFET, switch 640B is implemented with an NFET, switch 642A is implemented with a PFET, and switch 642B is implemented with a PFET. The gate of each of these transistors is coupled to output 1910 of the switch control circuit 680 to receive control signal enp. Each of switches 644A and 644B is implemented with a respective transmission gate including a PFET and an NFET coupled in parallel, in which the gate of the PFET is coupled to output 1920 of the switch control circuit 680 to receive control signal enn and the gate of the NFET is coupled to output 1910 of the switch control circuit 680 to receive control signal enp. Each of switches 646A and 646B is implemented with a respective transmission gate including a PFET and an NFET coupled in parallel, in which the gate of the PFET is coupled to output 1910 of the switch control circuit 680 to receive control signal enp and the gate of the NFET is coupled to output 1920 of the switch control circuit 680 to receive control signal enn.

In the example in FIG. 19B, switch 1332 is implemented with an NFET and switch 1334 is implemented with a PFET, in which the gate of each of the NFET and PFET is coupled to output 1910 of the switch control circuit 680 to receive control signal enp (shown in FIG. 19A). Each of switches 1322 and 1328 is implemented with a respective transmission gate including a PFET and an NFET coupled in parallel, in which the gate of the PFET is coupled to output 1910 of the switch control circuit 680 to receive control signal enp and the gate of the NFET is coupled to output 1920 of the switch control circuit 680 to receive control signal enn. Each of switches 1324 and 1338 is implemented with a respective transmission gate including a PFET and an NFET coupled in parallel, in which the gate of the PFET is coupled to output 1920 of the switch control circuit 680 to receive control signal enn and the gate of the NFET is coupled to output 1910 of the switch control circuit 680 to receive control signal enp. Note that the compensation circuits 1410 and 1420 are not shown in FIG. 19B for ease of illustration.

In this example, the switch control circuit 680 operates the hybrid driver 905 in the N-over-N driver mode and the hybrid LDO regulator 1310 in the first regulation mode by setting control signal enp to zero and control signal enn to one. The switch control circuit 680 may do this, for example, if the current value of the voltage control signal is in the first set of values (e.g., 0 to 23). The switch control circuit 680 operates the hybrid driver 905 in the P-over-N driver mode and the hybrid LDO regulator 1310 in the second regulation mode by setting control signal enp to one and control signal enn to zero. The switch control circuit 680 may do this, for example, if the current value of the voltage control signal is in the second set of values (e.g., 24 to 31).

It is to be appreciated that the switches in the hybrid driver 905 and the switches in the hybrid LDO regulator 1310 are not limited to the exemplary implementations shown in FIGS. 19A and 19B.

Figure 20:
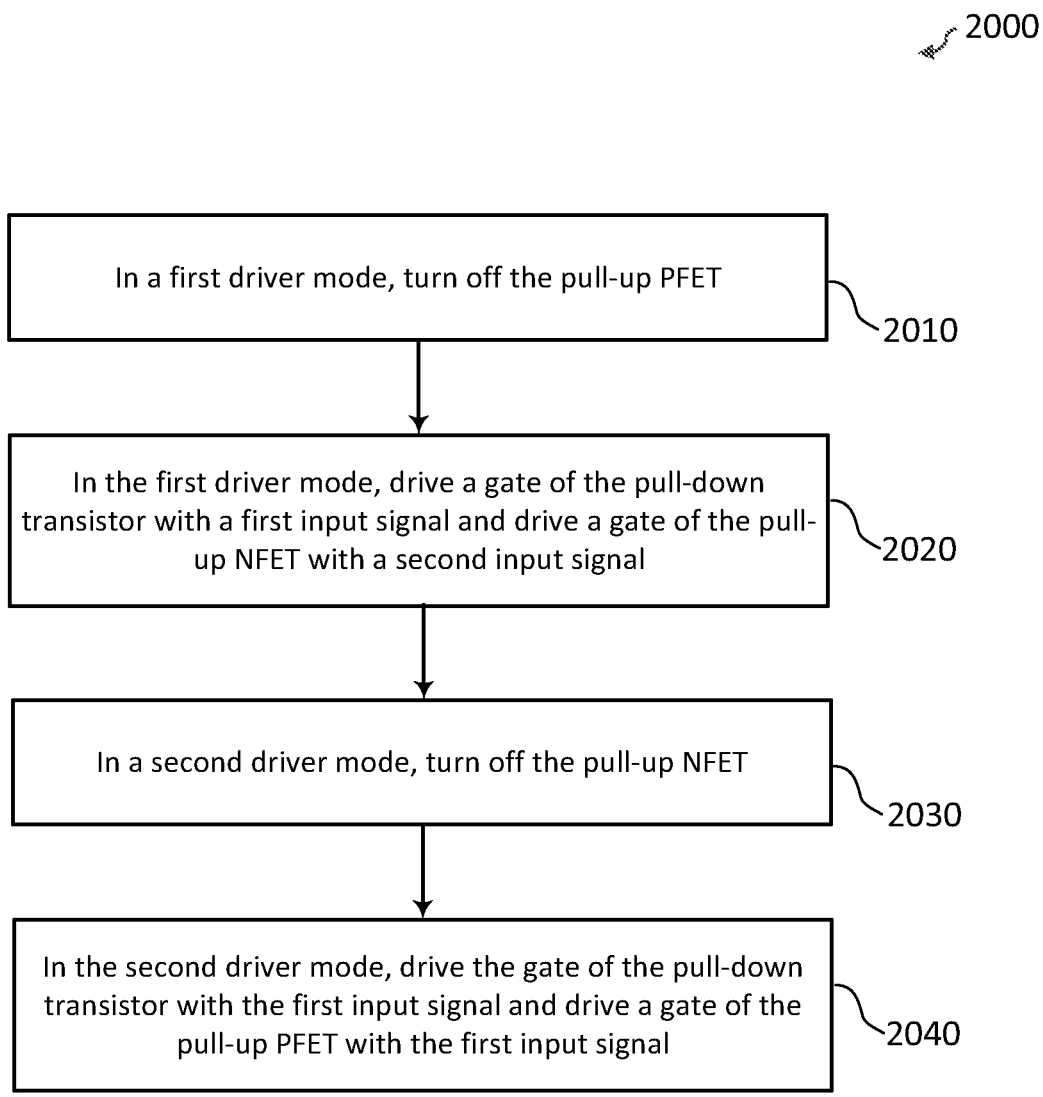
FIG. 20 is a flowchart illustrating a method for operating a hybrid driver according to certain aspects of the present disclosure.

FIG. 20 illustrates a method 2000 for operating a hybrid driver according to certain aspects of the present disclosure. The hybrid driver (e.g., hybrid driver 610) includes a pull-down transistor (e.g., pull-down NFET 620) coupled between an output (e.g., output 625) and a ground, a pull-up n-type field effect transistor (NFET) (e.g., pull-up NFET 630) coupled between a voltage rail (e.g., first voltage rail 655) and the output, and a pull-up p-type field effect transistor (PFET) (e.g., pull-up PFET 635) coupled between the voltage rail and the output.

At block 2010, in a first driver mode, the pull-up PFET is turned off. For example, the pull-up PFET may be turned off by turning on a switch (e.g., the second switch 642) coupled between the gate of the pull-up PFET and a second voltage rail (e.g., second voltage rail 660). The switch may be turned on by the switch control circuit 680. The first driver mode may correspond to the N-over-N driver mode.

At block 2020, in the first driver mode, a gate of the pull-down transistor is driven with a first input signal and a gate of the pull-up NFET is driven with a second input signal. The first signal may correspond to input signal inn and the second input signal may correspond to input signal inp. The first input signal and the second signal may be complementary. The gate of the pull-down transistor and the gate of the pull-up NFET may be driven by the pre-driver circuit 670.

At block 2030, in a second driver mode, the pull-up NFET is turned off. For example, the pull-up NFET may be turned off by turning on a switch (e.g., the first switch 640) coupled between the gate of the pull-up NFET and ground. The switch may be turned on by the switch control circuit 680. The second driver mode may correspond to the P-over-N driver mode.

At block 2040, in the second driver mode, the gate of the pull-down transistor is driven with the first input signal and a gate of the pull-up PFET is driven with the first input signal. The first signal may correspond to input signal inn. The gate of the pull-down transistor and the gate of the pull-up PFET may be driven by the pre-driver circuit 670.

It is to be appreciated that the present disclosure is not limited to the exemplary terminology used above to describe aspects of the present disclosure. For example, a driver may also be referred to as a transmitter, a driver circuit, or another term. In another example, a link may also be referred to as a channel, a transmission line, or another term. A slice may also be referred to as a slice unit or another term. In another example, an NFET may also be referred to as an n-type metal oxide semiconductor (NMOS) transistor, and a PFET may also be referred to as a p-type metal oxide semiconductor (PMOS) transistor. In another example, a pass transistor may also be referred to as a pass element, a pass device, or another term. An output pin may also be referred to as an output pad or another term, and an input pin may also be referred to as an input pad or another term.

Any references to elements herein using designations such as "first," "second," and so forth do not generally limit the quantity or order of those elements. Rather, these designations are used herein as a convenient way of distinguishing between two or more elements or instances of an element. Accordingly, it is to be appreciated that the designations "first," "second," and so forth in the claims do not necessarily correspond to the same designations in the written description. Further, it is to be appreciated that a reference to first and second elements does not mean that only two elements can be employed, or that the first element must precede the second element.

The term "coupled" is used herein to refer to direct or indirect electrical coupling between two structures. For instance, in one example of indirect electrical coupling, one structure may be coupled to another structure via a resistor.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

In the following, further implementations of the present disclosure are described.

Implementation 1. A chip, comprising:
 a driver, wherein the driver comprises:
  a pull-down transistor coupled between an output and a ground;
  a pull-up n-type field effect transistor (NFET) coupled between a first voltage rail and the output;
  a pull-up p-type field effect transistor (PFET) coupled between the first voltage rail and the output;
  a first switch coupled between a gate of the pull-up NFET and the ground; and
  a second switch coupled between a gate of the pull-up PFET and a second voltage rail.

Implementation 2. The chip of implementation 1, further comprising:
 an output pin; and
 a resistor coupled between the output pin and the output of the driver.

Implementation 3. The chip of implementation 1 or 2, further comprising a voltage regulator coupled between the second voltage rail and the first voltage rail, wherein the voltage regulator is configured to generate a regulated voltage from a supply voltage on the second voltage rail and output the regulated voltage on the first voltage rail.

Implementation 4. The chip of implementation 3, further comprising a control circuit configured to:
 turn off the first switch and turn on the second switch if the regulated voltage is within a first regulated voltage range; and
 turn on the first switch and turn off the second switch if the regulated voltage is within a second regulated voltage range.

Implementation 5. The chip of implementation 3 or 4, wherein the voltage regulator comprises a pass p-type field effect transistor (PFET) coupled between the first voltage rail and the second voltage rail.

Implementation 6. The chip of any one of implementations 1 to 5, further comprising a control circuit configured to:
 receive a control signal;
 turn off the first switch and turn on the second switch if the control signal has one of a first set of values; and
 turn on the first switch and turn off the second switch if the control signal has one of a second set of values.

Implementation 7. The chip of any one of implementations 1 to 6, wherein a gate of the pull-down transistor is coupled to a first input, and the driver further comprises:
 a third switch coupled between the gate of the pull-up PFET and the first input; and
 a fourth switch coupled between the gate of the pull-up NFET and a second input.

Implementation 8. The chip of implementation 7, wherein the first input and the second input are complementary inputs.

Implementation 9. The chip of implementation 7 or 8, further comprising a control circuit configured to:
 receive a control signal;
 turn off the first switch, turn on the second switch, turn off the third switch, and turn on the fourth switch if the control signal has one of a first set of values; and
 turn on the first switch, turn off the second switch, turn on the third switch, and turn off the fourth switch if the control signal has one of a second set of values.

Implementation 10. A chip, comprising:
 a multi-slice driver, wherein the multi-slice driver comprises multiple slices, each of slices comprising:
  a respective pull-down transistor coupled between a respective output and a ground;
  a respective pull-up n-type field effect transistor (NFET) coupled between a first voltage rail and the respective output;
  a respective pull-up p-type field effect transistor (PFET) coupled between the first voltage rail and the respective output;
  a respective first switch coupled between a gate of the respective pull-up NFET and the ground; and a respective second switch coupled between a gate of the respective pull-up PFET and a second voltage rail.

Implementation 11. The chip of implementation 10, further comprising:
an output pin; and
a resistor coupled between the output pin and the output of each of the slices.

Implementation 12. The chip of implementation 10 or 11, further comprising a voltage regulator coupled between the second voltage rail and the first voltage rail, wherein the voltage regulator is configured to generate a regulated voltage from a supply voltage on the second voltage rail and output the regulated voltage on the first voltage rail.

Implementation 13. The chip of implementation 12, further comprising a control circuit configured to:
turn off the first switch and turn on the second switch in each of the slices if the regulated voltage is within a first regulated voltage range; and
turn on the first switch and turn off the second switch in each of the slices if the regulated voltage is within a second regulated voltage range.

Implementation 14. The chip of any one of implementations 10 to 13, further comprising a control circuit configured to:
receive a control signal;
turn off the first switch and turn on the second switch in each of the slices if the control signal has one of a first set of values; and
turn on the first switch and turn off the second switch in each of the slices if the control signal has one of a second set of values.

Implementation 15. A chip, comprising:
a driver, wherein the driver comprises:
a first pull-down transistor coupled between a first output and a ground;
a second pull-down transistor coupled between a second output and the ground;
a first pull-up n-type field effect transistor (NFET) coupled between a first voltage rail and the first output;
a second pull-up NFET coupled between the first voltage rail and the second output;
a first pull-up p-type field effect transistor (PFET) coupled between the first voltage rail and the first output;
a second pull-up PFET coupled between the first voltage rail and the second output;
a first switch coupled between a gate of the first pull-up NFET and the ground;
a second switch coupled between a gate of the second pull-up NFET and the ground;
a third switch coupled between a gate of the first pull-up PFET and a second voltage rail; and
a fourth switch coupled between a gate of the first pull-up PFET and the second voltage rail.

Implementation 16. The chip of implementation 15, further comprising:
a first output pin;
a first resistor coupled between the first output pin and the first output of the driver;
a second output pin; and
a second resistor coupled between the second output pin and the second output of the driver.

Implementation 17. The chip of implementation 15 or 16, further comprising a voltage regulator coupled between the second voltage rail and the first voltage rail, wherein the voltage regulator is configured to generate a regulated voltage from a supply voltage on the second voltage rail and output the regulated voltage on the first voltage rail.

Implementation 18. The chip of implementation 17, further comprising a control circuit configured to:
turn off the first switch, turn off the second switch, turn on the third switch, and turn on the fourth switch if the regulated voltage is within a first regulated voltage range; and
turn on the first switch, turn on the second switch, turn off the third switch, and turn off the fourth switch if the regulated voltage is within a second regulated voltage range.

Implementation 19. The chip of implementation 17 or 18, wherein the voltage regulator comprises a pass p-type field effect transistor (PFET) coupled between the first voltage rail and the second voltage rail.

Implementation 20. The chip of any one of implementations 15 to 19, further comprising a control circuit configured to:
receive a control signal;
turn off the first switch, turn off the second switch, turn on the third switch, and turn on the fourth switch if the control signal has one of a first set of values; and
turn on the first switch, turn on the second switch, turn off the third switch, and turn off the fourth switch if the control signal has one of a second set of values.

Implementation 21. The chip of any one of implementations 15 to 20, wherein a gate of the first pull-down transistor is coupled to a first input, a gate of the second pull-down transistor is coupled to a second input, and the driver further comprises:
a fifth switch coupled between the gate of the first pull-up PFET and the first input;
a sixth switch coupled between the gate of the second pull-up PFET and the second input;
a seventh switch coupled between the gate of the first pull-up NFET and the second input; and
an eighth switch coupled between the gate of the second pull-up NFET and the first input.

Implementation 22. The chip of implementation 21, wherein the first input and the second input are complementary inputs.

Implementation 23. The chip of implementation 21 or 22, further comprising a control circuit configured to:
receive a control signal;
turn off the first switch, turn off the second switch, turn on the third switch, turn on the fourth switch, turn off the fifth switch, turn off the sixth switch, turn on the seventh switch, and turn on the eighth switch if the control signal has one of a first set of values; and
turn on the first switch, turn on the second switch, turn off the third switch, turn off the fourth switch, turn on the fifth switch, turn on the sixth switch, turn off the seventh switch, and turn off the eighth switch if the control signal has one of a second set of values.

Implementation 24. A method for operating a hybrid driver, the hybrid driver including a pull-down transistor coupled between an output and a ground, a pull-up n-type field effect transistor (NFET) coupled between a voltage rail and the output, and a pull-up p-type field effect transistor (PFET) coupled between the voltage rail and the output, the method including:
in a first driver mode, turning off the pull-up PFET;
in the first driver mode, driving a gate of the pull-down transistor with a first input signal and driving a gate of the pull-up NFET with a second input signal;

in a second driver mode, turning off the pull-up NFET; and in the second driver mode, driving the gate of the pull-down transistor with the first input signal and driving a gate of the pull-up PFET with the first input signal.

Implementation. The method of implementation 24, wherein the first input signal and the second input signal are complementary signals.

Implementation 26. The method of implementation 24 or 25, further comprising:

generating a regulated voltage using a voltage regulator; and outputting the regulated voltage on the voltage rail.

Implementation 27. The method of implementation 26, further comprising:

operating the driver in the first driver mode if the regulated voltage is within a first regulated voltage range; and operating the driver in the second driver mode if the regulated voltage is within a second regulated voltage range.

Implementation 28. The method of any one of implementations 24 to 27, further comprising:

receiving a control signal;

operating the driver in the first driver mode if the control signal has one of a first set of values; and operating the driver in the second driver mode if the control signal has one of a second set of values.

What is claimed is:

1. A chip, comprising:
a driver, wherein the driver comprises:
   a pull-down transistor coupled between an output and a ground;
   a pull-up n-type field effect transistor (NFET) coupled between a first voltage rail and the output;
   a pull-up p-type field effect transistor (PFET) coupled between the first voltage rail and the output;
   a first switch coupled between a gate of the pull-up NFET and the ground;
   a second switch coupled between a gate of the pull-up PFET and a second voltage rail;
   a third switch coupled between the gate of the pull-up PFET and a first input; and
   a fourth switch coupled between the gate of the pull-up NFET and a second input, wherein a gate of the pull-down transistor is coupled to the first input and wherein the first input and the second input are complementary inputs; and
a control circuit configured to:
   turn off the first switch, turn on the second switch, turn off the third switch, and turn on the fourth switch to operate the driver in a first driver mode; and
   turn on the first switch, turn off the second switch, turn on the third switch, and turn off the fourth switch to operate the driver in a second driver mode.

2. The chip of claim 1, further comprising:
an output pin; and
a resistor coupled between the output pin and the output of the driver.

3. The chip of claim 1, further comprising a voltage regulator coupled between the second voltage rail and the first voltage rail, wherein the voltage regulator is configured to generate a regulated voltage on the second voltage rail derived from a supply voltage on the second voltage rail, wherein the voltage regulator is configured to supply the regulated voltage within a first regulated voltage range or within a second regulated voltage range based on a voltage control signal input to the voltage regulator.

4. The chip of claim 3, wherein the control circuit is configured to operate the driver in the first driver mode if the regulated voltage is within the first regulated voltage range and operate the driver in the second driver mode if the regulated voltage is within the second regulated voltage range.

5. The chip of claim 3, wherein the voltage regulator comprises a pass p-type field effect transistor (PFET) coupled between the first voltage rail and the second voltage rail.

6. The chip of claim 1, wherein the first driver mode comprises an NFET-over-NFET driver mode and the second driver mode comprises a PFET-over-NFET driver mode.

7. A chip comprising:
a driver, wherein the driver comprises:
   a pull-down transistor coupled between an output and a ground;
   a pull-up n-type field effect transistor (NFET) coupled between a first voltage rail and the output;
   a pull-up p-type field effect transistor (PFET) coupled between the first voltage rail and the output;
   a first switch coupled between a gate of the pull-up NFET and the ground;
   a second switch coupled between a gate of the pull-up PFET and a second voltage rail;
   a third switch coupled between the gate of the pull-up PFET and a first input; and
   a fourth switch coupled between the gate of the pull-up NFET and a second input, wherein a gate of the pull-down transistor is coupled to the first input and wherein the first input and the second input are complementary inputs; and
a control circuit configured to:
   receive a control signal;
   turn off the first switch, turn on the second switch, turn off the third switch, and turn on the fourth switch if the control signal has one of a first set of values; and
   turn on the first switch, turn off the second switch, turn on the third switch, and turn off the fourth switch if the control signal has one of a second set of values.

8. A chip, comprising:
a multi-slice driver, wherein the multi-slice driver comprises multiple slices, each of slices comprising:
   a respective pull-down transistor coupled between a respective output and a ground;
   a respective pull-up n-type field effect transistor (NFET) coupled between a first voltage rail and the respective output;
   a respective pull-up p-type field effect transistor (PFET) coupled between the first voltage rail and the respective output;
   a respective first switch coupled between a gate of the respective pull-up NFET and the ground;
   a respective second switch coupled between a gate of the respective pull-up PFET and a second voltage rail;
   a respective third switch coupled between the gate of the pull-up PFET and a first input; and
   a respective fourth switch coupled between the gate of the pull-up NFET and a second input, wherein a gate of the pull-down transistor is coupled to the first input and wherein the first input and the second input are complementary inputs; and
a control circuit configured to:

turn off the first switch, turn on the second switch, turn off the third switch, and turn on the fourth switch of each of the slices to operate the driver in a first driver mode; and
turn on the first switch, turn off the second switch, turn on the third switch, and turn off the fourth switch of each of the slices to operate the driver in a second driver mode.

9. The chip of claim 8, further comprising:
an output pin; and
a resistor coupled between the output pin and the output of each of the slices.

10. The chip of claim 8, further comprising a voltage regulator coupled between the second voltage rail and the first voltage rail, wherein the voltage regulator is configured to generate a regulated voltage on the first voltage rail derived from a supply voltage on the second voltage rail, wherein the voltage regulator is configured to supply the regulated voltage within a first regulated voltage range or a second regulated voltage range based on a voltage control signal input to the voltage regulator.

11. The chip of claim 10, wherein the control circuit is configured to operate the driver in the first driver mode if the regulated voltage is within the first regulated voltage range and operate the driver in the second driver mode if the regulated voltage is within the second regulated voltage range.

12. The chip of claim 8, wherein the first driver mode comprises an NFET-over-NFET driver mode and the second driver mode comprises a PFET-over-NFET driver mode.

13. A chip, comprising:
a driver, wherein the driver comprises:
a first pull-down transistor coupled between a first output and a ground;
a second pull-down transistor coupled between a second output and the ground;
a first pull-up n-type field effect transistor (NFET) coupled between a first voltage rail and the first output;
a second pull-up NFET coupled between the first voltage rail and the second output;
a first pull-up p-type field effect transistor (PFET) coupled between the first voltage rail and the first output;
a second pull-up PFET coupled between the first voltage rail and the second output;
a first switch coupled between a gate of the first pull-up NFET and the ground;
a second switch coupled between a gate of the second pull-up NFET and the ground;
a third switch coupled between a gate of the first pull-up PFET and a second voltage rail; and
a fourth switch coupled between a gate of the second pull-up PFET and the second voltage rail;
a fifth switch coupled between the gate of the first pull-up PFET and a first input;
a sixth switch coupled between the gate of the second pull-up PFET and a second input;
a seventh switch coupled between the gate of the first pull-up NFET and the second input; and
an eighth switch coupled between the gate of the second pull-up NFET and the first input, wherein a gate of the first pull-down transistor is coupled to the first input and a gate of the second pull-down transistor is coupled to the second input and wherein the first input and the second input are complementary inputs; and a control circuit configured to:
turn off the first switch, turn off the second switch, turn on the third switch, turn on the fourth switch, turn off the fifth switch, turn off the sixth switch, turn on the seventh switch, and turn on the eighth switch to operate the driver in a first driver mode; and
turn on the first switch, turn on the second switch, turn off the third switch, turn off the fourth switch, turn on the fifth switch, turn on the sixth switch, turn off the seventh switch, and turn off the eighth switch to operate the driver in a second driver mode.

14. The chip of claim 13, further comprising:
a first output pin;
a first resistor coupled between the first output pin and the first output of the driver;
a second output pin; and
a second resistor coupled between the second output pin and the second output of the driver.

15. The chip of claim 13, further comprising a voltage regulator coupled between the second voltage rail and the first voltage rail, wherein the voltage regulator is configured to generate a regulated voltage on the first voltage rail derived from a supply voltage on the second voltage rail, wherein the voltage regulator is configured to supply the regulated voltage within a first regulated voltage range or a second regulated voltage range based on a voltage control signal input to the voltage regulator.

16. The chip of claim 15, wherein the control circuit is configured to operate the driver in the first driver mode if the regulated voltage is within the first regulated voltage range and operate the driver in the second driver mode if the regulated voltage is within the second regulated voltage range.

17. The chip of claim 16, wherein the voltage regulator comprises a pass p-type field effect transistor (PFET) coupled between the first voltage rail and the second voltage rail.

18. The chip of claim 13, wherein the first driver mode comprises an NFET-over-NFET driver mode and the second driver mode comprises a PFET-over-NFET driver mode.

19. A chip comprising
a driver, wherein the driver comprises:
a first pull-down transistor coupled between a first output and a ground;
a second pull-down transistor coupled between a second output and the ground;
a first pull-up n-type field effect transistor (NFET) coupled between a first voltage rail and the first output;
a second pull-up NFET coupled between the first voltage rail and the second output;
a first pull-up p-type field effect transistor (PFET) coupled between the first voltage rail and the first output;
a second pull-up PFET coupled between the first voltage rail and the second output;
a first switch coupled between a gate of the first pull-up NFET and the ground;
a second switch coupled between a gate of the second pull-up NFET and the ground;
a third switch coupled between a gate of the first pull-up PFET and a second voltage rail;
a fourth switch coupled between a gate of the second pull-up PFET and the second voltage rail;
a fifth switch coupled between the gate of the first pull-up PFET and the first input;

a sixth switch coupled between the gate of the second pull-up PFET and the second input;

a seventh switch coupled between the gate of the first pull-up NFET and the second input; and an eighth switch coupled between the gate of the second pull-up NFET and the first input, wherein a gate of the first pull-down transistor is coupled to the first input and a gate of the second pull-down transistor is coupled to the second input and wherein the first input and the second input are complementary inputs; and a control circuit configured to:

receive a control signal;

turn off the first switch, turn off the second switch, turn on the third switch, turn on the fourth switch, turn off the fifth switch, turn off the sixth switch, turn on the seventh switch, and turn on the eighth switch if the control signal has one of a first set of values; and turn on the first switch, turn on the second switch, turn off the third switch, turn off the fourth switch, turn on the fifth switch, turn on the sixth switch, turn off the seventh switch, and turn off the eighth switch if the control signal has one of a second set of values.

\* \* \* \* \*